United States Patent
Hwang et al.

(10) Patent No.: US 9,159,882 B2
(45) Date of Patent: Oct. 13, 2015

(54) SEMICONDUCTOR LIGHT-EMITTING DEVICE

(71) Applicant: Samsung Electronics Co., Ltd., Suwon-Si, Gyeonggi-Do (KR)

(72) Inventors: Kyung-Wook Hwang, Hwaseong-si (KR); Ju-Bin Seo, Seoul (KR); Ji-Hye Yeon, Cheongju-si (KR); Geon-Wook Yoo, Seongnam-si (KR); Dong-hoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/501,232

(22) Filed: Sep. 30, 2014

(65) Prior Publication Data

US 2015/0207038 A1 Jul. 23, 2015

(30) Foreign Application Priority Data

Jan. 20, 2014 (KR) .......................... 10-2014-0006747

(51) Int. Cl.
| | | |
|---|---|---|
| *H01L 33/10* | (2010.01) | |
| *H01L 33/46* | (2010.01) | |
| *H01L 33/08* | (2010.01) | |
| *H01L 33/24* | (2010.01) | |
| *H01L 33/42* | (2010.01) | |
| *H01L 33/40* | (2010.01) | |

(52) U.S. Cl.
CPC ................ *H01L 33/46* (2013.01); *H01L 33/08* (2013.01); *H01L 33/24* (2013.01); *H01L 33/405* (2013.01); *H01L 33/42* (2013.01)

(58) Field of Classification Search
CPC ...... H01L 33/20; H01L 33/382; H01L 33/387; H01L 33/08; H01L 27/15; H01L 27/153; H01L 27/156; H01L 33/22; H01L 33/24
USPC .......................................... 257/88, 95, 98, 13
See application file for complete search history.

(56) References Cited

U.S. PATENT DOCUMENTS

| 6,372,608 B1 | 4/2002 | Shimoda et al. |
|---|---|---|
| 6,645,830 B2 | 11/2003 | Shimoda et al. |
| RE38,466 E | 3/2004 | Inoue et al. |

(Continued)

FOREIGN PATENT DOCUMENTS

KR 1020120040550 A 4/2012

*Primary Examiner* — Earl Taylor
(74) *Attorney, Agent, or Firm* — Harness, Dickey & Pierce, P.L.C.

(57) ABSTRACT

A semiconductor light-emitting device includes a first conductive type semiconductor layer having a main surface, a plurality of vertical type light-emitting structures protruding upward from the first conductive type semiconductor layer; a transparent electrode layer covering the plurality of vertical type light-emitting structures; and an insulation-filling layer disposed on the transparent electrode layer. The insulation-filling layer extends parallel to the first conductive type semiconductor layer so as to cover the plurality of vertical type light-emitting structures. A selected one of the first conductive type semiconductor layer and the insulation-filling layer, which is disposed on a light transmission path through which light generated from the plurality of vertical type light-emitting structures is radiated externally, has an uneven outer surface. The uneven outer surface is opposite to an inner surface of the selected one, and the inner surface faces the plurality of vertical type light-emitting structures.

20 Claims, 21 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,714,337 B2 * | 5/2010 | Kim et al. .................... 257/94 |
| 7,759,140 B2 | 7/2010 | Lee et al. |
| 7,781,727 B2 | 8/2010 | Sherrer et al. |
| 7,790,482 B2 | 9/2010 | Han et al. |
| 7,829,443 B2 * | 11/2010 | Seifert et al. ................ 438/478 |
| 7,919,780 B2 * | 4/2011 | Lee ................................ 257/79 |
| 7,940,350 B2 | 5/2011 | Jeong |
| 7,947,989 B2 * | 5/2011 | Ha et al. ......................... 257/79 |
| 7,959,312 B2 | 6/2011 | Yoo et al. |
| 7,964,881 B2 * | 6/2011 | Choi et al. ...................... 257/89 |
| 7,985,976 B2 * | 7/2011 | Choi et al. ...................... 257/89 |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 * | 9/2012 | Choi et al. ...................... 257/89 |
| 8,263,990 B2 | 9/2012 | Armitage |
| 8,324,646 B2 | 12/2012 | Lee et al. |
| 8,350,251 B1 * | 1/2013 | Lowgren et al. ............... 257/13 |
| 8,390,010 B2 * | 3/2013 | Sills et al. ...................... 257/98 |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,937,295 B2 * | 1/2015 | Lowgren et al. ............... 257/13 |
| 2008/0036038 A1 | 2/2008 | Hersee et al. |
| 2010/0096614 A1 | 4/2010 | Kim et al. |
| 2010/0283064 A1 * | 11/2010 | Samuelson et al. ............ 257/88 |
| 2011/0240959 A1 * | 10/2011 | Konsek et al. .................. 257/13 |
| 2011/0254034 A1 * | 10/2011 | Konsek et al. .................. 257/98 |
| 2011/0309382 A1 * | 12/2011 | Lowgren ......................... 257/88 |
| 2012/0132888 A1 * | 5/2012 | Kwak et al. .................... 257/13 |
| 2013/0099199 A1 * | 4/2013 | Cha et al. ........................ 257/13 |
| 2013/0112944 A1 * | 5/2013 | Cha et al. ........................ 257/13 |
| 2013/0200391 A1 | 8/2013 | Bedair et al. |
| 2013/0221322 A1 | 8/2013 | Ohlsson |
| 2014/0209858 A1 * | 7/2014 | Cha et al. ........................ 257/13 |
| 2014/0246647 A1 * | 9/2014 | Cha et al. .......................... 257/9 |
| 2015/0118777 A1 * | 4/2015 | Seo et al. ........................ 438/34 |

* cited by examiner

SEMICONDUCTOR LIGHT-EMITTING DEVICE

CROSS-REFERENCE TO RELATED APPLICATIONS

This application claims priority to Korean Patent Application No. 10-2014-0006747, filed on Jan. 20, 2014, in the Korean Intellectual Property Office, the disclosure of which is incorporated herein in its entirety by reference.

BACKGROUND

The inventive concepts relate to a light-emitting device, and more particularly, to a semiconductor light-emitting device having a three-dimensional (3D)-type nanostructure.

Light-emitting diodes (LEDs), which are semiconductor light-emitting devices, are widely used in various lightsources. For example, LEDs are used for backlighting, lighting devices, signal lamps, and large display devices. As the LED market for illumination has expanded and products having higher current and/or higher output have been required, semiconductor light-emitting devices having a 3D type nanostructure have been developed.

SUMMARY

The inventive concepts provide a semiconductor light-emitting device having a three-dimensional (3D)-type nanostructure which can improve light extraction efficiency thereof.

According to some example embodiments of the inventive concepts, there is provided a semiconductor light-emitting device including a first conductive type semiconductor layer having a main surface, a plurality of vertical type light-emitting structures protruding upward from the main surface of the first conductive type semiconductor layer, a transparent electrode layer covering at least a portion of each of the plurality of vertical type light-emitting structures, and an insulation-filling layer disposed on the transparent electrode layer, the insulation-filling layer extending parallel to the main surface of the first conductive type semiconductor layer so as to cover an upper portion of each of the plurality of vertical type light-emitting structures, wherein a selected one of the first conductive type semiconductor layer and the insulation-filling layer, which is disposed on a light transmission path through which light generated from the plurality of vertical type light-emitting structures is radiated externally, has an uneven outer surface opposite to an inner surface of the selected one, the inner surface facing the plurality of vertical type light-emitting structures.

In some example embodiments, the other one of the first conductive type semiconductor layer and the insulation-filling layer, which is positioned on the opposite side of the light transmission path, centered on the plurality of vertical type light-emitting structures, may have a flat surface that is an opposite surface of a surface of the other one facing the plurality of vertical type light-emitting structures.

In some example embodiments, the semiconductor light-emitting device may further include a substrate covering a surface of the first conductive type semiconductor layer which is opposite to the main surface of the first conductive type semiconductor layer, wherein the substrate has a flat surface facing the first conductive type semiconductor layer.

In some example embodiments, the semiconductor light-emitting device may further include a substrate covering a surface of the first conductive type semiconductor layer which is opposite to the main surface of the first conductive type semiconductor layer, wherein the substrate has an uneven surface facing the first conductive type semiconductor layer.

In some example embodiments, the insulation-filling layer may include a first portion filling spaces between the plurality of vertical type light-emitting structures, and a second portion integrally connected to the first portion, wherein the second portion is formed on the first portion and extends parallel to the main surface of the first conductive type semiconductor layer so as to cover an upper portion of each of the plurality of vertical type light-emitting structures.

In some example embodiments, the insulation-filling layer may include a first insulating layer covering only a portion of each of the plurality of vertical type light-emitting structures between the plurality of vertical type light-emitting structures; and a second insulating layer disposed on the first insulating layer, the second insulating layer extending parallel to the main surface of the first conductive type semiconductor layer so as to cover a top portion of each of the plurality of vertical type light-emitting structures.

In some example embodiments, the first insulating layer and the second insulating layer each may include a light-transmissive insulating layer, and the transparent electrode layer is interposed between the first insulating layer and the second insulating layer.

In some example embodiments, the semiconductor light-emitting device may further include a reflective electrode layer having a flat surface facing the plurality of vertical type light-emitting structures, wherein the first insulating layer includes a light-transmissive insulating layer, and the second insulating layer includes an insulating reflective layer that is interposed between the light-transmissive insulating layer and the reflective electrode layer.

In some example embodiments, the semiconductor light-emitting device may further include a reflective electrode layer having a flat surface facing the plurality of vertical type light-emitting structures, wherein the insulation-filling layer includes a light-transmissive insulating layer covering only a portion of each of the plurality of vertical type light-emitting structures between the plurality of vertical type light-emitting structures, and an insulating reflective layer extending parallel to the main surface of the first conductive type semiconductor layer so as to cover a top portion of each of the plurality of vertical type light-emitting structures between the light-transmissive insulating layer and the reflective electrode layer.

In some example embodiments, the transparent electrode layer may extend between the plurality of vertical type light-emitting structures and the light-transmissive insulating layer and between the plurality of vertical type light-emitting structures and the insulating reflective layer.

In some example embodiments, the insulating reflective layer may have a multi-layer structure in which at least two materials having different refractive indices are alternately stacked at least two times.

In some example embodiments, the semiconductor light-emitting device may further include a light-transmissive insulating layer filling spaces between the plurality of vertical type light-emitting structures, wherein the transparent electrode layer is interposed between the light-transmissive insulating layer and the insulation-filling layer.

In some example embodiments, the semiconductor light-emitting device may further include a metal electrode layer that is disposed on the insulation-filling layer and extends parallel to the main surface of the first conductive type semiconductor layer so as to cover the plurality of vertical type light-emitting structures, and has a flat surface facing the plurality of vertically type light-emitting structures.

In some example embodiments, the semiconductor light-emitting device may further include an insulating reflective layer extending parallel to the main surface of the first conductive type semiconductor layer between the insulation-filling layer and the metal electrode layer, the insulating reflective layer configured to reflect light generated from the plurality of vertical type light-emitting structures in a direction that becomes more distant from the metal electrode layer before the light reaches the metal electrode layer in a path of light radiated toward the metal electrode layer.

According to some example embodiments of the inventive concepts, there is provided a semiconductor light-emitting device including a first conductive type semiconductor layer having a main surface and a backside surface opposite to the main surface, the backside surface having an uneven portion, a plurality of vertical type light-emitting structures protruding upward from the main surface of the first conductive type semiconductor layer; a transparent electrode layer covering at least a portion of each of the plurality of vertical type light-emitting structures, an insulation-filling layer disposed on the first conductive type semiconductor layer, the insulation-filling layer covering at least a portion of each of the plurality of vertical type light-emitting structures, a metal electrode layer disposed on the insulation-filling layer, the metal electrode layer extending parallel to the main surface of the first conductive type semiconductor layer so as to cover the plurality of vertical type light-emitting structures and having a flat surface facing the plurality of vertical type light-emitting structures, and an insulating reflective layer extending parallel to the main surface of the first conductive type semiconductor layer between the insulation-filling layer and the metal electrode layer.

In some example embodiments, the insulation-filling layer may include a first portion filling spaces between the plurality of vertical type light-emitting structures, and a second portion integrally connected to the first portion, wherein the second portion is formed on the first portion and extends parallel to the main surface of the first conductive type semiconductor layer so as to cover an upper portion of each of the plurality of vertical type light-emitting structures.

In some example embodiments, the insulation-filling layer may include a first light-transmissive insulating layer covering a portion of each of the plurality of vertical type light-emitting structures between the plurality of vertical type light-emitting structures, and the first light-transmissive insulating layer is interposed between the transparent electrode layer and the insulating reflective layer.

In some example embodiments, the insulation-filling layer may include a first light-transmissive insulating layer covering a portion of each of the plurality of vertical type light-emitting structures between the plurality of vertical type light-emitting structures, and the transparent electrode layer is interposed between the first light-transmissive insulating layer and the insulating reflective layer.

In some example embodiments, the semiconductor light-emitting device may further include a second light-transmissive insulating layer interposed between the transparent electrode layer and the insulating reflective layer.

According to some example embodiments of the inventive concepts, there is provided a semiconductor light-emitting device including a first conductive type semiconductor layer, a plurality of vertical type light-emitting structures protruding upward from the first conductive type semiconductor layer, a transparent electrode layer covering at least a portion of each of the plurality of vertical type light-emitting structures, an insulation-filling layer disposed on the transparent electrode, the insulation-filling layer extending parallel to the first conductive type semiconductor layer so as to cover a top portion of each of the plurality of vertical type light-emitting structures, a first electrode connected to the transparent electrode via the insulation-filling layer, the first electrode extending in a finger-type on the transparent electrode layer so as to cover a portion of each of the plurality of vertical type light-emitting structures, and a second electrode connected to the first conductive type semiconductor layer, wherein the first conductive type semiconductor layer has a first inner surface and a flat outer surface opposite to the first inner surface, the first inner surface facing the plurality of vertical type light-emitting structures, and wherein the insulation-filling layer has a second inner surface and an uneven outer surface opposite to the second inner surface, the second inner surface facing the plurality of vertical type light-emitting structures, has an uneven portion.

DETAILED DESCRIPTION OF EXAMPLE EMBODIMENTS

Figure 1:
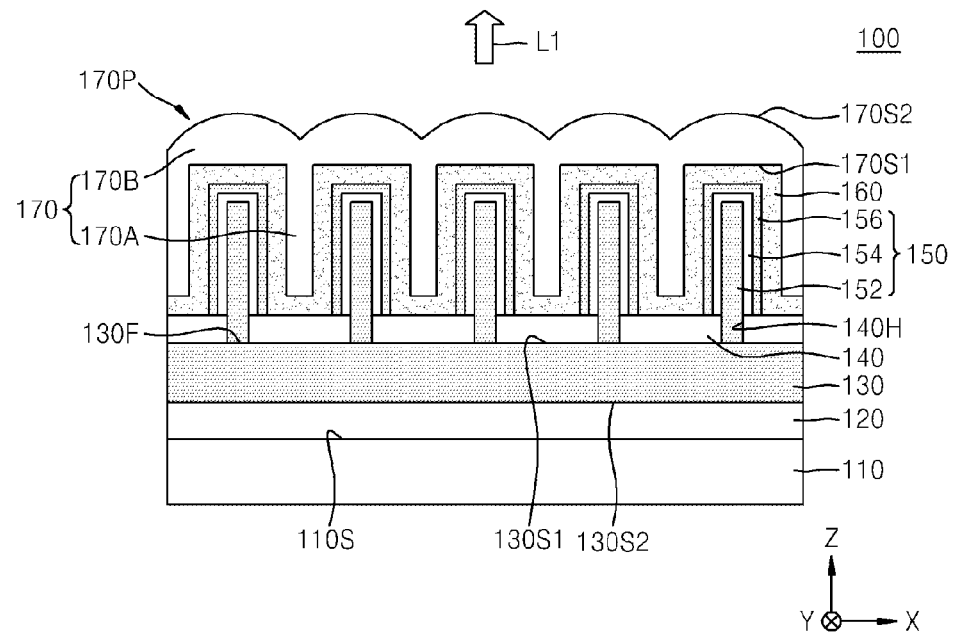
FIG. 1 is a cross-sectional view of a semiconductor light-emitting device according to some example embodiments of the inventive concepts.

The inventive concepts will now be described more fully with reference to the accompanying drawings, in which example embodiments of the inventive concepts are shown. In the drawings, the same elements are denoted by the same reference numerals and a repeated explanation thereof will not be given.

Hereinafter, the inventive concepts will be described more fully with reference to the accompanying drawings, in which example embodiments of the inventive concepts are shown. The inventive concepts may, however, be embodied in many different forms and should not be construed as being limited to the embodiments set forth herein; rather these embodiments are provided so that this disclosure will be thorough and complete, and will fully convey the concept of the inventive concepts to one of ordinary skill in the art.

It will be understood that, although the terms "first", "second", "third", etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments. For example, a first element may be referred to as a second element, and likewise, a second element may be referred to as a first element without departing from the scope of the inventive concepts.

As such, variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing.

FIG. 1 is a cross-sectional view of a semiconductor light-emitting device 100 according to some example embodiments of the inventive concepts.

Referring to FIG. 1, the semiconductor light-emitting device 100 includes a substrate 110, a buffer layer 120 formed on the substrate 110, a first conductive type semiconductor layer 130 formed on the buffer layer 120, a plurality of vertical type light-emitting structures 150 protruding upward from the first conductive type semiconductor layer 130 in the Z direction of FIG. 1 from a main surface 130F of the first conductive type semiconductor layer 130, a transparent electrode layer 160 covering at least a portion of each of the plurality of vertical type light-emitting structures 150, and an insulation-filling layer 170 formed on the transparent electrode layer 160.

The insulation-filling layer 170 includes a first portion 170A filling spaces between the plurality of vertical type light-emitting structures 150, and a second portion 170B that is integrally connected to the first portion 170A, formed on the first portion 170A, and extends parallel to the main surface 130F of the first conductive type semiconductor layer 130 so as to cover an upper portion of each of the plurality of vertical type light-emitting structures 150.

The first portion 170A of the insulation-filling layer 170 is disposed between adjacent vertical type light-emitting structures 150 and thus may prevent the plurality of vertical type light-emitting structures 150 from falling.

The insulation-filling layer 170 may include a light-transmissive insulating layer. For example, the insulation-filling layer 170 may be formed of spin on glass (SOG), $SiO_2$, ZnO, SiN, $Al_2O_3$, or a combination thereof.

In some example embodiments, the insulation-filling layer 170 may have a constant refractive index. The insulation-filling layer 170 may be formed of a material having a refractive index that is the same as or lower than the refractive index of at least some of the vertical type light-emitting structures 150. For example, the insulation-filling layer 170 may have a refractive index of about 1 to about 2.5.

In the semiconductor light-emitting device 100, light generated from the plurality of vertical type light-emitting structures 150 may penetrate the transparent electrode layer 160 and the insulation-filling layer 170 and may be radiated externally in an arrow direction L1.

The insulation-filling layer 170 includes a first surface 170S1 facing the plurality of vertical type light-emitting structures 150 and a second surface 170S2 that is opposite to the first surface 170S1 and is relatively distant from the plurality of vertical type light-emitting structures 150. The second surface 170S2 has a plurality of uneven portions 170P formed in a direction (X direction in FIG. 1) that is parallel to the main surface 130F of the first conductive type semiconductor layer 130. As the plurality of uneven portions 170P are formed in the second surface 170S2, a possibility that light radiated through materials placed in upper portions of the plurality of vertical type light-emitting structures 150 is reflected back into a light-emitting device chip before exiting to the outside may be reduced, and thus, light exiting to the outside of upper sides of the plurality of vertical type light-emitting structures 150 may increase, thereby improving light extraction efficiency. A detailed description will be provided with reference to FIGS. 7A and 7B later.

The first conductive type semiconductor layer 130 is positioned on the opposite side of a light transmission path of the arrow direction L1, centered on the plurality of vertical type light-emitting structures 150, and includes a first surface 130S1 (e.g., the main surface 130F) facing the plurality of vertical type light-emitting structures 150 and a second surface 130S2 that is opposite to the first surface 130S1 and is relatively distant from the plurality of vertical type light-emitting structures 150. The second surface 130S2 is flat in an extending direction (X direction of FIG. 1) of the main surface 130F. In the substrate 110 covering the second surface 130S2 of the first conductive type semiconductor layer 130 with the buffer layer 120 interposed therebetween, a surface 110S facing the first conductive type semiconductor layer 130 is flat. Accordingly, both surfaces of the buffer layer 120 interposed between the substrate 110 and the first conductive type semiconductor layer 130 are also flat.

The substrate 110 may be provided as a substrate for semiconductor growth. In some example embodiments, the substrate 110 may be formed of an insulating material, a conductive material, a semiconductor material, or a combination thereof. For example, the substrate 110 may be formed of sapphire, silicon (Si), silicon carbide (SiC), gallium nitride (GaN), gallium arsenide (GaAs), zinc oxide (ZnO), zinc boron ($ZnB_2$), gallium phosphorus (GaP), diamond, magnesium aluminum oxide ($MgAl_2O_4$), magnesium oxide (MgO), lithium aluminum oxide ($LiAlO_2$), lithium gallium oxide ($LiGaO_2$), or a combination thereof.

When the substrate 110 is a sapphire substrate, the sapphire substrate is a crystal having Hexa-Rhombo R3c symmetry and may have a lattice constant of about 13.001 Å in a c-axis direction and a lattice distance (e.g., distance between lattices) of about 4.765 Å in an a-axis direction. The sapphire substrate may have an orientation plane of C(0001) plane, A(1120) plane, or R(1102) plane.

When a Si substrate is used as the substrate 110, the substrate 110 may be a wafer having a large diameter of 300 mm or more. When a Si substrate is used as the substrate 110, a nucleation layer formed of a material such as $Al_xGa_{1-x}N$ may be formed on the substrate 110, and then a nitride semiconductor having a desired structure may be grown on the nucleation layer.

In some example embodiments, the substrate 110 may be omitted.

The buffer layer 120 may be formed of $Al_xIn_yGa_{1-x-y}N$ ($0 \leq x \leq 1$, $0 \leq y \leq 1$). For example, the buffer layer 120 may be formed of GaN, AlN, AlGaN, $ZrB_2$, $HfB_2$, ZrN, HfN, TiN, or a combination thereof. In some example embodiments, the buffer layer 120 may have a multi-layer structure, such as a AlInN/GaN structure, an $In_xGa_{1-x}N$/GaN ($0 \leq x \leq 1$, $0 \leq y \leq 1$) structure, or an $Al_xIn_yGa_{1-x-y}N$/$In_xGa_{1-x}N$/GaN ($0 \leq x \leq 1$, $0 \leq y \leq 1$) structure. In some example embodiments, the buffer layer 120 may be formed at a low temperature without doping.

The buffer layer 120 may relieve lattice unconformity between the substrate 110 and the first conductive type semiconductor layer 130. For example, when the first conductive type semiconductor layer 130 is formed of GaN and a GaN thin film is grown on the substrate 110 that is a heterogeneous substrate, a defect may occur due to lattice constant discordance between the substrate 110 and the GaN thin film. Warpage causing a crack to the substrate 110 may occur due to a difference in thermal expansion coefficient. After forming the buffer layer 120 on the substrate 110, the first conductive type semiconductor layer 130 formed of a nitride semiconductor having a desired structure may be formed on the buffer layer 120 to control the defect and the warpage. The buffer layer 120 may be omitted depending on characteristics and process conditions of a light-emitting device.

The first conductive type semiconductor layer 130 may be formed of a Group III-V compound. In some example embodiments, the first conductive type semiconductor layer 130 may be formed of GaN doped with n-type impurities (hereinafter, referred to as "n-GaN"). The n-type impurities may be formed of a group V element.

An insulating pattern 140 is formed on the first conductive type semiconductor layer 130. A plurality of openings 140H exposing selected areas of the first conductive type semiconductor layer 130 are formed in the insulating pattern 140.

The plurality of vertical type light-emitting structures 150 protrude on the insulating pattern 140 in the Z direction of FIG. 1. Each of the plurality of vertical type light-emitting structures 150 includes a nano core 152, an active layer 154, and a second conductive type semiconductor layer 156. The nano core 152 is grown through the opening 140H formed in the insulating pattern 140 from a selected area of the first conductive type semiconductor layer 130 to protrude on the insulating pattern 140. The active layer 154 is formed on the nano core 152 to surround a surface of the nano core 152. The second conductive type semiconductor layer 156 covers the active layer 154. Each of the plurality of vertical type light-emitting structures 150 may have a core-shell structure that includes a core portion formed of the nano core 152 and a shell portion formed of the active layer 154 and the second conductive type semiconductor layer 156.

The plurality of openings 140H formed in the insulating pattern 140 may determine the diameter, cross-sectional shape, length, and position of the nano core 152 grown from the selected areas of the first conductive type semiconductor layer 130. A plane cross-sectional shape of each of the plurality of openings 140H may be, for example, a circle, an ellipse, or a polygon.

In some example embodiments, the plurality of openings 140H may have a width of the same size in a predetermined direction, for example, in the X direction and/or Y direction of FIG. 1. In some example embodiments, the plurality of openings 140H may have widths of different sizes in a predetermined direction. In some example embodiments, the plurality of openings 140H may be formed to have a diameter or width that is selected in the range of about tens of nanometers to about hundreds of nanometers.

In some example embodiments, the insulating pattern 140 may be formed of silicon oxide, silicon nitride, titanium oxide, aluminum oxide, or a combination thereof.

In FIG. 1, each of the plurality of nano cores 152 in the plurality of vertical type light-emitting structures 150 has a nano-rod shape. However, the inventive concepts are not limited thereto. For example, each of the plurality of nano cores 152 may have a nano-pyramid shape.

Each of the plurality of nano cores 152 may have any one of various plane cross-sectional shapes, such as a circle, an ellipse, a polygon, and the like, according to a plane shape of the plurality of openings 140H. In addition, each of the plurality of nano cores 152 may have a vertical cross-sectional shape, such as a horn shape, a cone shape, or a pillar shape. Growth conditions of the plurality of nano cores 152 in the plurality of vertical type light-emitting structures 150 may vary according to the size of the plurality of openings 140H. In some example embodiments, the plurality of nano cores 152 may be formed of n-GaN.

Diameters, widths, doping concentrations of the plurality of nano cores 152 in the plurality of vertical type light-emitting structures 150 may be variously set so that one light-emitting device emits light of various wavelengths. A light-emitting device that emits light having a wavelength which is different from that of light emitted from the semiconductor light-emitting device 100 may be combined with the semiconductor light-emitting device 100 to implement a white device in a package unit.

The plurality of active layers 154 in the plurality of vertical type light-emitting structures 150 are regions in which electrons and holes are recombined, and may be formed to surround upper surfaces and sidewalls of the plurality of nano cores 152.

The plurality of active layers 154 may be formed of a material comprising $Al_xIn_yGa_{1-x-y}N$ ($0 \leq x \leq 1$, $0 \leq y \leq 1$). Each of the plurality of active layers 154 may have a single quantum well (SQW) structure including only one quantum well layer, a multi quantum well (MQW) structure including a plurality of quantum well layers, or a superlattice (SL) structure. For example, each of the plurality of active layers 154 may have a single layer structure formed of InGaN. In an embodiment, each of the plurality of active layers 154 may have a quantum well structure in which a GaN layer and an InGaN layer are alternately disposed.

In some example embodiments, the plurality of active layers 154 may be formed by using a metal organic chemical vapor deposition (MOCVD) process, a hydride vapor phase epitaxy (HVPE) process, or a molecular beam epitaxy (MBE) process.

The second conductive type semiconductor layer 156 may be formed to surround upper surfaces and sidewalls of the plurality of active layers 154. The second conductive type semiconductor layer 156 may be formed of a Group III-V compound. In some example embodiments, the second conductive type semiconductor layer 156 may be formed of GaN doped with p-type impurities (hereinafter, referred to as "p-GaN"). The p-type impurities may be formed of a group III element, e.g., Mg, Zn, or Be. Holes may move to the active layer 154 through the second conductive type semiconductor layer 156.

In the active layer 154, light may be generated as holes flowing through the second conductive type semiconductor layer 156 and electrons flowing through the nano core 152 are combined. In the active layer 154, light of energy corresponding to an excitation level of a quantum well or an energy bandgap difference may be emitted.

Since the plurality of vertical type light-emitting structures 150 have a three-dimensional (3D) form, they have a larger light-emitting surface area than thin film-type light-emitting structures and thus may increase light emission efficiency. In some example embodiments, the semiconductor light-emitting device 100 may include hundreds of thousands to millions of light-emitting structures.

The transparent electrode layer 160 contacting the second conductive type semiconductor layer 156 may be formed to cover a portion of an upper surface of the insulating pattern 140 and an external surface of the second conductive type semiconductor layer 156. A configuration in which the transparent electrode layer 160 contacts the second conductive type semiconductor layer 156 throughout the total vertical length of sidewalls of the plurality of vertical type light-emitting structures 150 is illustrated in FIG. 1. However, according to the inventive concepts, the transparent electrode layer 160 may be formed to cover only a portion of the external surface of the second conductive type semiconductor layer 156. A more specific example will be described with reference to FIG. 6A later.

In some example embodiments, the transparent electrode layer 160 may be formed of transparent conductive oxide (TCO). For example, the transparent electrode layer 160 may be formed of indium tin oxide (ITO), aluminum zinc oxide (AZO), indium zinc oxide (IZO), ZnO, gallium doped zinc oxide (GZO) (ZnO:Ga), $In_2O_3$, $SnO_2$, CdO, $CdSnO_4$, $Ga_2O_3$, or a combination thereof. In some example embodiments, the transparent electrode layer 160 may be formed of indium oxide containing an additive, such as Mg, Ag, Zn, Sc, Hf, Zr, Te, Se, Ta, W, Nb, Cu, Si, Ni, Co, Mo, Cr, Sn, or a combination thereof. However, the inventive concepts are not limited thereto.

In some example embodiments, the transparent electrode layer 160 may have a thickness of about 10 nm to about 300 nm.

Figure 2A:
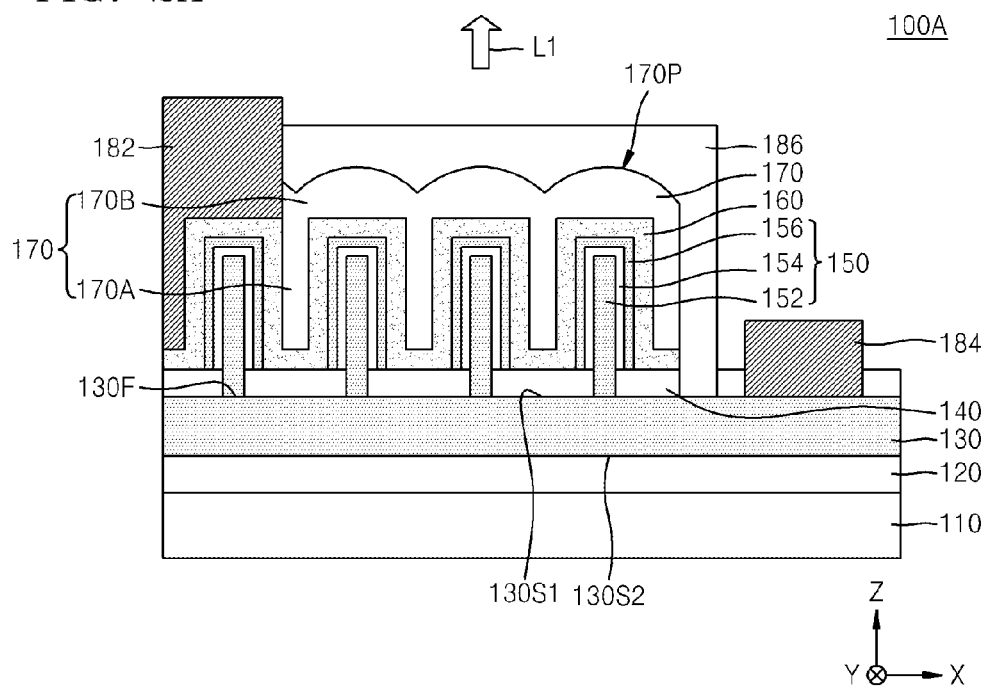
FIG. 2A is a cross-sectional view of a semiconductor light-emitting device according to some example embodiments of the inventive concepts.

FIG. 2A is a cross-sectional view of a semiconductor light-emitting device 100A according to another embodiment of the inventive concepts.

The semiconductor light-emitting device 100A illustrated in FIG. 2A is a horizontal type semiconductor light-emitting device including the structure of the semiconductor light-emitting device 100 of FIG. 1.

The semiconductor light-emitting device 100A includes a first electrode 182 that penetrates the insulation-filling layer 170 and contacts the transparent electrode layer 160, and a second electrode 184 that contacts the main surface 130F of the first conductive type semiconductor layer 130. The first electrode 182 and the second electrode 184 are separate from each other with a passivation layer 186 interposed therebetween. The passivation layer 186 may protect the first conductive type semiconductor layer 130, the plurality of vertical type light-emitting structures 150, the transparent electrode layer 160, and the insulation-filling layer 170 from an external environment.

In some example embodiments, the passivation layer 186 may be formed of silicon oxide, silicon nitride, or a combination thereof. However, the inventive concepts are not limited thereto.

Figure 2B:
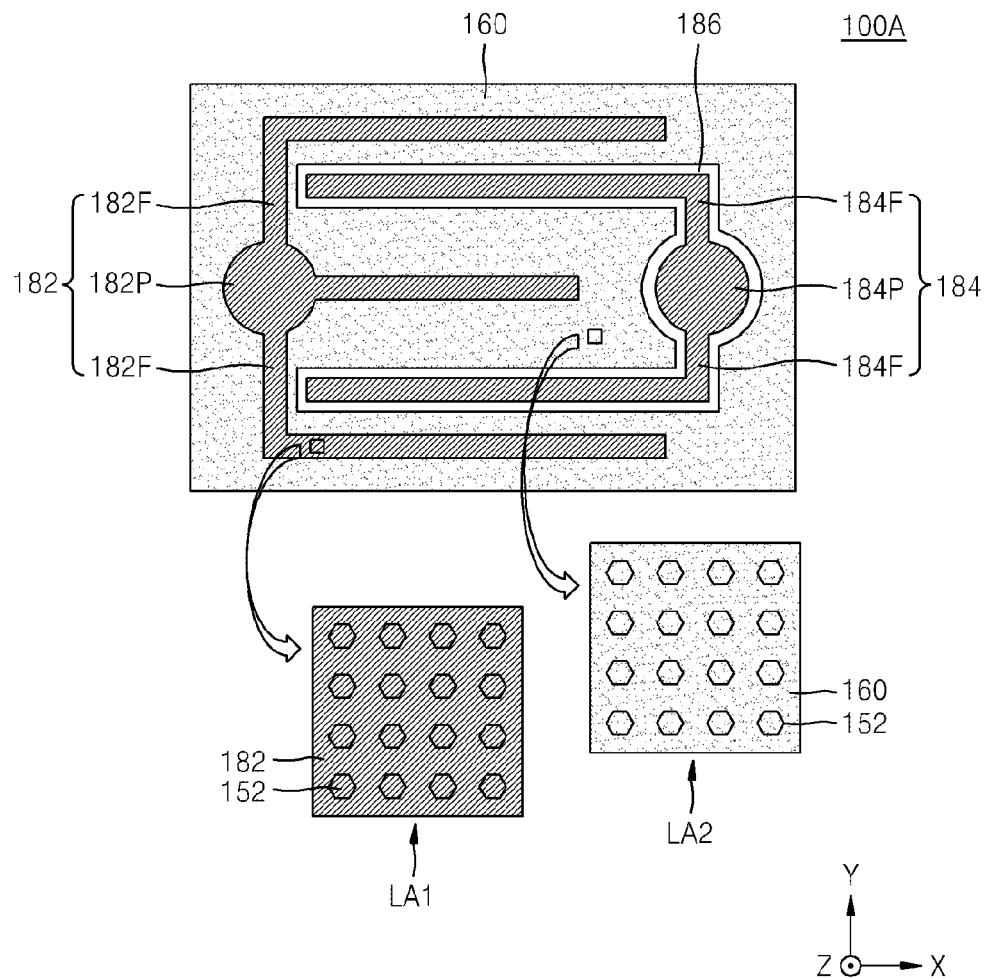
FIG. 2B is a plan view of a planar structure of first and second electrodes disposed in the semiconductor light-emitting device illustrated in FIG. 2A according to some example embodiments of the inventive concepts.

FIG. 2B is a plan view of a planar structure of the first and second electrodes 182 and 184 which may be used in the semiconductor light-emitting device 100A of the vertical structure illustrated in FIG. 2A. In FIG. 2B, the transparent electrode layer 160 and the first conductive type semiconductor layer 130 are illustrated together to describe a disposition relation between the transparent electrode layer 160 and the first and second electrodes 182 and 184.

Referring to FIG. 2B, the transparent electrode layer 160 is formed to cover an area of the first surface 130S1, which is covered with the second electrode 184, and an area excluding a surrounding area of the area covered with the second electrode 184. The first surface 130S1 corresponds to the main surface 130F of the first conductive type semiconductor layer 130.

The first electrode 182 and the second electrode 184 each may be a finger-type electrode. The first electrode 182 may include at least one first electrode pad 182P formed on an upper surface of the transparent electrode layer 160 and at least one first electrode finger 182F that is connected to the at least one first electrode pad 182P and is branched off from the at least one first electrode pad 182P to extend therefrom.

The second electrode 184 may include at least one second electrode pad 184P formed on the main surface 130F of the first conductive type semiconductor layer 130 and at least one second electrode finger 184F that is connected to the at least one second electrode pad 184P and is branched off from the at least one second electrode pad 184P to extend therefrom.

In FIG. 2B, the first electrode 182 includes one first electrode pad 182P and three first electrode fingers 182F and the second electrode 184 includes one second electrode pad 184P and two second electrode fingers 184F. However, the inventive concepts are not limited thereto, and the structures of the first and second electrodes 182 and 184 may be variously modified or changed.

Shapes and dispositions of the first and second electrodes 182 and 184 may be determined so that the first and second electrodes 182 and 184 have the same resistance. As the first and second electrodes 182 and 184 have the same resistance, uniform current flows through all areas of the first and second electrodes 182 and 184, and uniform current may be applied to the active layer 154 of each of the plurality of vertical type light-emitting structures 150.

The first electrode 182 and the second electrode 184 each may be formed of Ag, Al, Ni, Cr, Pd, Cu, Pt, Sn, W, Au, Rh, Ir, Ru, Mg, Zn, or a combination thereof or alloy thereof. In some example embodiments, the first electrode 182 and the second electrode 184 each may have a multi-layer structure including at least two types of metals, such as Ni/Ag, Zn/Ag, Ni/Al, Zn/Al, Pd/Ag, Pd/Al, Ir/Ag, Ir/Au, Pt/Ag, Pt/Al, or Ni/Ag/Pt. The first electrode 182 and the second electrode 184 may be formed of the same material as each other. Alternatively, the first electrode 182 and the second electrode 184 may be formed of different materials.

The first electrode pad 182P and the first electrode finger 182F of the first electrode 182 each may be formed to cover the plurality of vertical type light-emitting structures 150. A magnified local area LA1, in which the nano cores 152 of the plurality of vertical type light-emitting structures 150 are covered with the transparent electrode layer 160 and the first electrode 182, and a magnified local area LA2, in which the nano cores 152 are covered with the transparent electrode layer 160 but not covered with the first electrode 182, are shown in FIG. 2B.

Although a horizontal cross-sectional shape of each of the plurality of nano cores 152 illustrated in FIG. 2B is a hexagon, the inventive concepts are not limited thereto. In addition, although the plurality of nano cores 152 illustrated in FIG. 2B are arranged linearly in the X direction and the Y direction and thus are disposed in a matrix form, the inventive concepts are not limited thereto. For example, the plurality of nano cores 152 may be arranged in a zigzag form along at least one of the X direction and the Y direction.

FIGS. 3A to 3G are cross-sectional views illustrated according to a process sequence to describe a method of manufacturing a semiconductor light-emitting device, according to an embodiment of the inventive concepts. A method of manufacturing the semiconductor light-emitting device 100A illustrated in FIG. 2A is described with reference to FIGS. 3A to 3G.

Figure 3A:
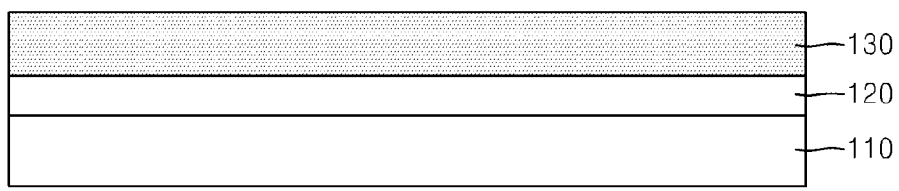
FIGS. 3A to 3G are cross-sectional views illustrating a method of manufacturing a semiconductor light-emitting device, according to some example embodiments of the inventive concepts.

Referring to FIG. 3A, a buffer layer 120 and a first conductive type semiconductor layer 130 are sequentially formed on a substrate 110.

In some example embodiments, the buffer layer 120 and the first conductive type semiconductor layer 130 may be formed by an MOCVD process, a HVPE process, or an MBE process.

Figure 3B:
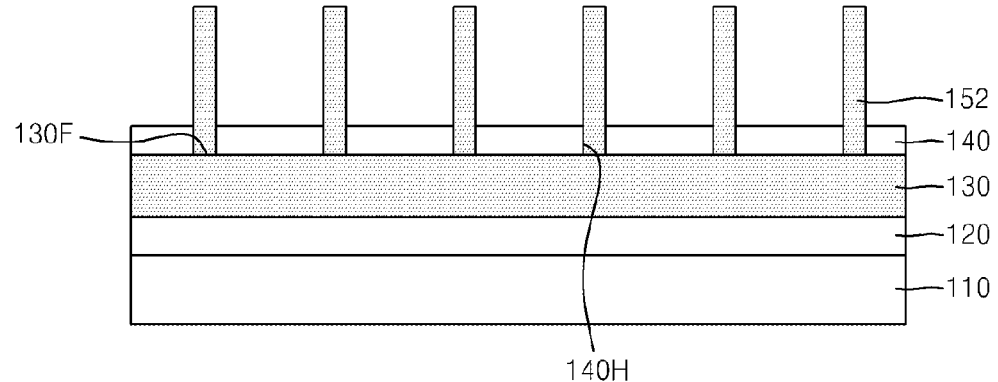

Referring to FIG. 3B, an insulating pattern 140 is formed on the first conductive type semiconductor layer 130 and a plurality of openings 140H exposing a main surface 130F of the first conductive type semiconductor layer 130 are formed in the insulating pattern 140.

A semiconductor layer is grown from the main surface 130F of the first conductive type semiconductor layer 130, which is exposed through the plurality of openings 140H, by using an epitaxial growing method, and thus, a plurality of nano cores 152 are formed.

Figure 3C:
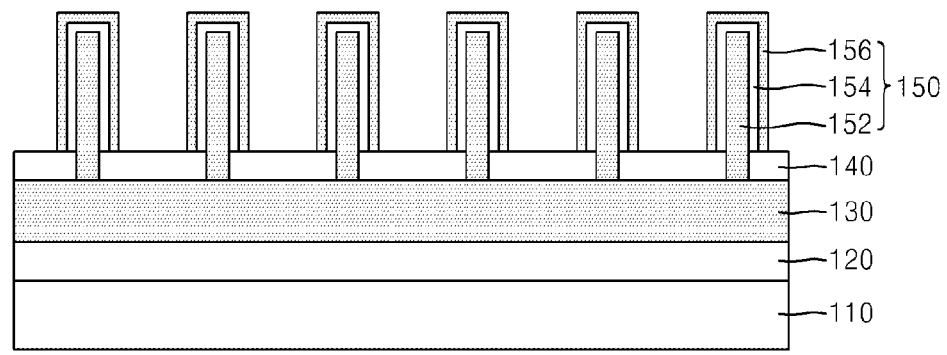

Referring to FIG. 3C, an active layer 154 surrounding the plurality of nano cores 152 and a second conductive type semiconductor layer 156 covering the active layer 154 are sequentially formed to form a plurality of vertical type light-emitting structures 150.

In some example embodiments, an MOCVD process, a HVPE process, or an MBE process may be used to form the plurality of vertical type light-emitting structures 150.

Figure 3D:
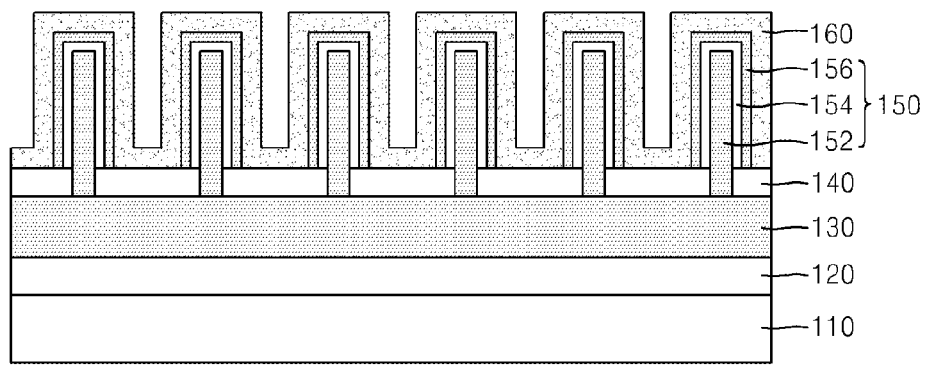

Referring to FIG. 3D, a transparent electrode layer 160 covering the insulating pattern 140 and the plurality of vertical type light-emitting structures 150 is formed.

The transparent electrode layer 160 may be formed to continuously extend on the entire surface of the substrate 110. In some example embodiments, a magnetron sputtering process, a sol-gel process, a pulsed laser deposition (PLD) process, or an MOCVD process may be used to form the transparent electrode layer 160.

Figure 3E:
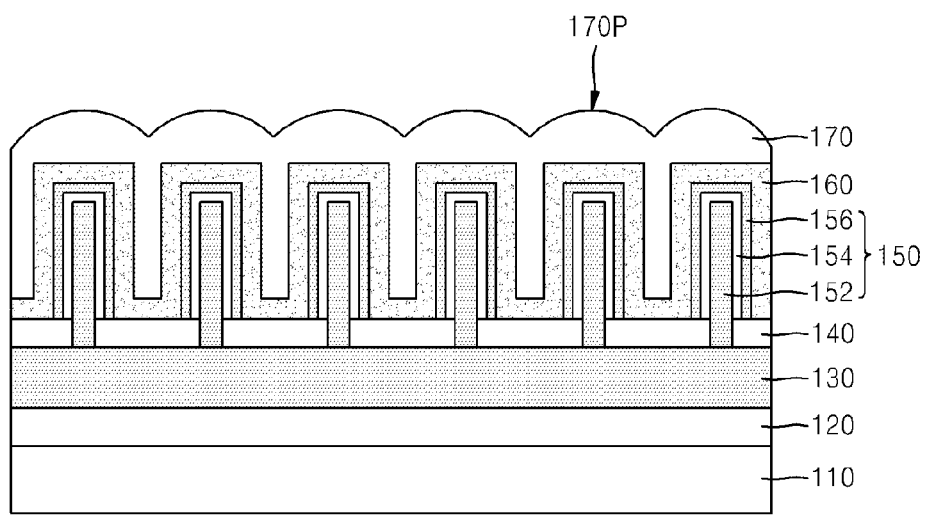

Referring to FIG. 3E, an insulation-filling layer 170 is formed on the transparent electrode layer 160.

The insulation-filling layer 170 is formed on the transparent electrode layer 160 to fill spaces between the plurality of vertical type light-emitting structures 150. In some example embodiments, the insulation-filling layer 170 may be formed by a chemical vapor deposition (CVD) process or a plasma-enhanced CVD (PECVD). For example, the insulation-filling layer 170 may be formed by a CVD process using tetraethyl orthosilicate (TEOS) as raw materials.

When forming the insulation-filling layer 170, a process atmosphere for the deposition of an insulating material may be controlled so that a plurality of uneven portions 170P are formed on an upper surface of the insulation-filling layer 170.

Figure 3F:
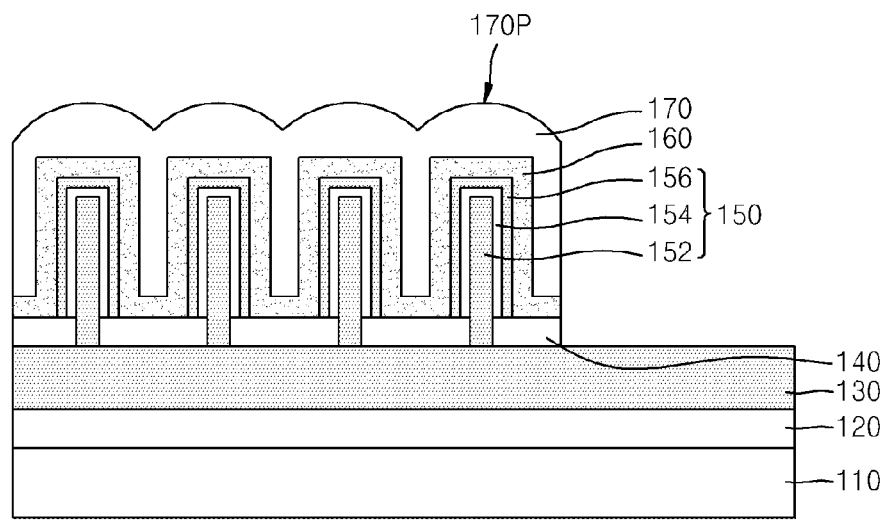

Referring to FIG. 3F, after forming a mask pattern having a predetermined-shaped opening on the insulation-filling layer 170, the insulation-filling layer 170, the transparent electrode layer 160, the plurality of vertical type light-emitting structures 150, and the insulating pattern 140 may be mesa-etched by using the mask pattern as an etch mask to expose an area of the first conductive type semiconductor layer 130. Then, the mask pattern used as the etch mask is removed.

Figure 3G:
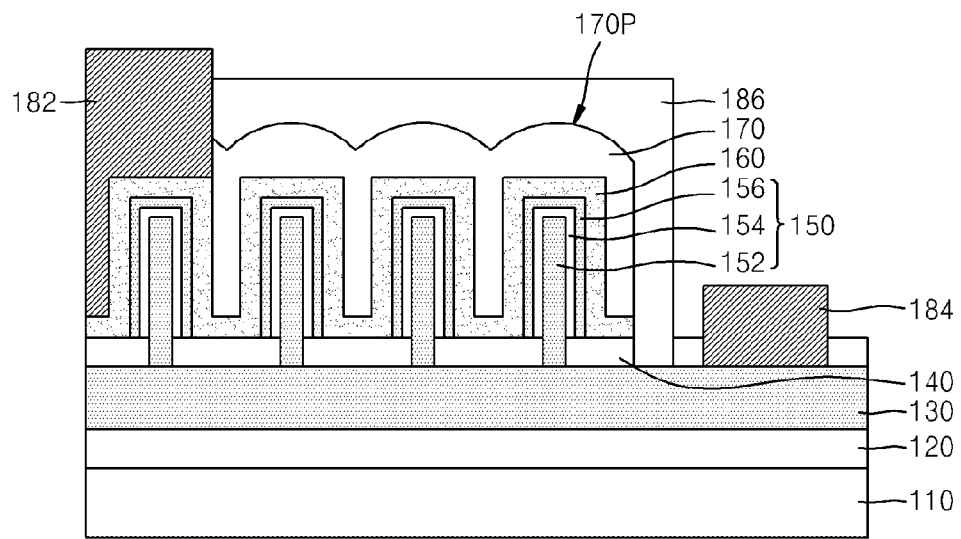

Referring to FIG. 3G, a passivation layer 186 covering a mesa-etched resultant structure of FIG. 3F is formed. A portion of the passivation layer 186 and a portion of the insulation-filling layer 170 are etched to expose a portion of the transparent electrode layer 160 and a portion of the first conductive type semiconductor layer 130 to the outside.

A first electrode 182 and a second electrode 184 are formed on the exposed portion of the transparent electrode layer 160 and the exposed portion of the first conductive type semiconductor layer 130, and thus, the semiconductor light-emitting device 100A illustrated in FIG. 2A may be obtained.

Figure 4A:
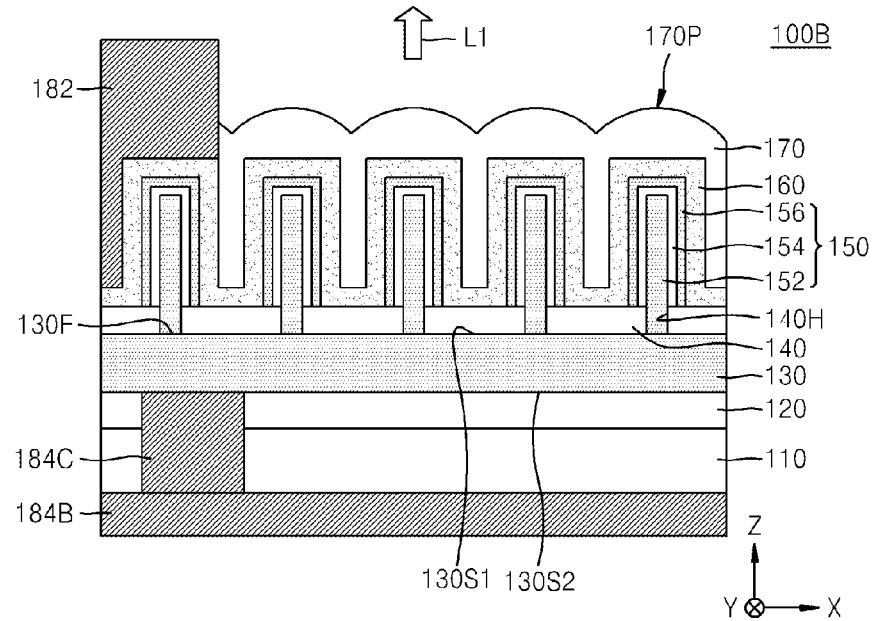
FIG. 4A is a cross-sectional view of a semiconductor light-emitting device according to some example embodiments of the inventive concepts.

FIG. 4A is a cross-sectional view of a semiconductor light-emitting device 100B according to another example embodiment of the inventive concepts.

The semiconductor light-emitting device 100B illustrated in FIG. 4A is a vertical type semiconductor light-emitting device including the structure of the semiconductor light-emitting device 100 of FIG. 1.

The semiconductor light-emitting device 100B includes a first electrode 182 that penetrates the insulation-filling layer 170 and contacts the transparent electrode layer 160, and a second electrode 184B that contacts the first conductive type semiconductor layer 130 through a contact 184C formed from a second surface 130S2 of the first conductive type semiconductor layer 130. The contact 184C may penetrate a substrate 110 and a buffer layer 120 and be connected to the first conductive type semiconductor layer 130.

In the semiconductor light-emitting device 100B illustrated in FIG. 4A, the substrate 110 may be a silicon substrate or a metal substrate. In some example embodiments, the first electrode 182 may have a planar structure as described with reference to FIG. 2B. The second electrode 184B may be formed to cover the entire surface of the substrate 110. Description of the material of the second electrode 184B is as those of the second electrode 184 with reference to FIG. 2B and thus are not repeatedly provided.

In the vertical type semiconductor light-emitting device 100B illustrated in FIG. 4A, a region corresponding to an area that is required for forming the second electrode 184 may be additionally used as a light-emitting area, compared to the horizontal type semiconductor light-emitting device 100A.

Figure 4B:
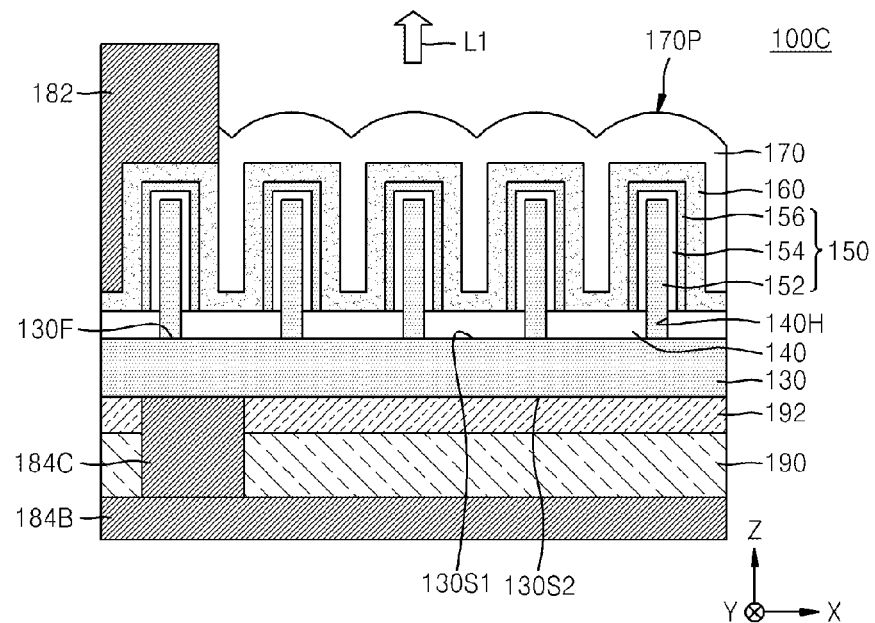
FIG. 4B is a cross-sectional view of a semiconductor light-emitting device according to some example embodiments of the inventive concepts.

FIG. 4B is a cross-sectional view of a semiconductor light-emitting device 100C according to another example embodiment of the inventive concepts.

The semiconductor light-emitting device 100C illustrated in FIG. 4B is a vertical type semiconductor light-emitting device including a part of the structure of the semiconductor light-emitting device 100 of FIG. 1.

The semiconductor light-emitting device 100C illustrated in FIG. 4B has substantially the same structure as the semiconductor light-emitting device 100B except that the semiconductor light-emitting device 100C includes a receptor substrate 190 and a reflective layer 192 instead of the substrate 110 and the buffer layer 120.

To form the semiconductor light-emitting device 100C, the substrate 110 may be removed after forming the semiconductor light-emitting device 100 illustrated in FIG. 1. When the substrate 110 is formed of sapphire and the buffer layer 120 is formed of SiC, the substrate 110 may be removed by using the buffer layer 120 as an etch-stop layer and using a wet etching process using an etchant formed of sulfuric acid ($H_2SO_4$), phosphoric acid ($H_3PO_4$), or a combination thereof. Next, the buffer layer 120 may be removed by using a reactive ion etching (RIE) process or an inductive coupled plasma/reactive ion etching (ICP/RIE) process to expose the second surface 130S2 of the first conductive type semiconductor layer 130. The reflective layer 192 and the receptor substrate 190 are formed on the second surface 130S2 of the first conductive type semiconductor layer 130. In some example embodiments, the receptor substrate 190 may be attached on the second surface 130S2 of the first conductive type semiconductor layer 130 by using the reflective layer 192 as an adhesive layer.

In some example embodiments, the receptor substrate 190 may be formed of Si, GaAs, GaP, CuW, Mo, W, or a combination thereof. The reflective layer 192 may be formed of Pt, Al, Rh, Ti, Ni, Au, a combination thereof, or an alloy thereof. However, according to the inventive concepts, the material of the receptor substrate 190 and the material of the reflective layer 192 are not limited thereto and may be modified or changed.

Figure 5:
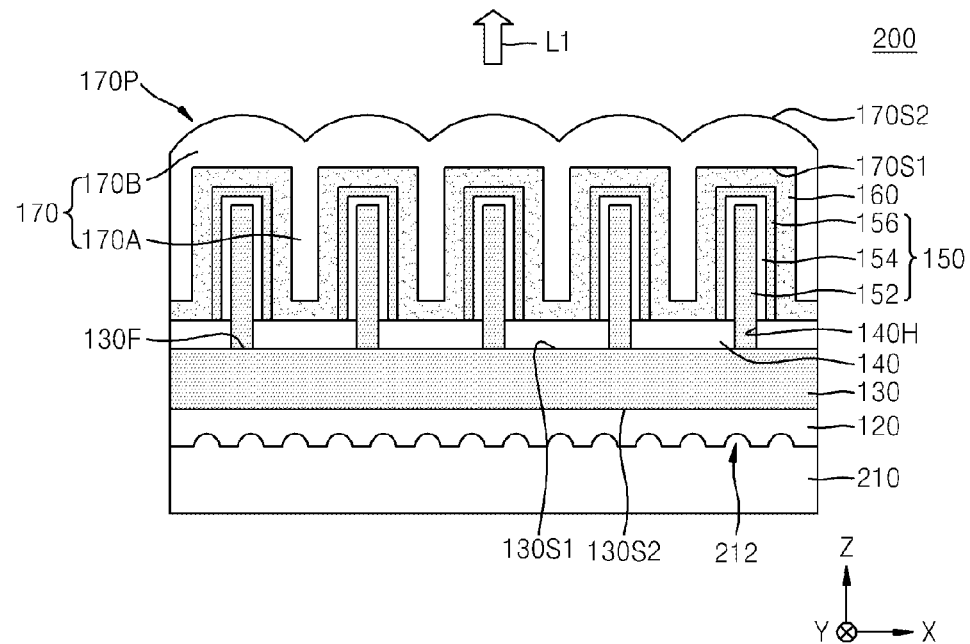
FIG. 5 is a cross-sectional view of a semiconductor light-emitting device according to some example embodiments of the inventive concepts.

FIG. 5 is a cross-sectional view of a semiconductor light-emitting device 200 according to another embodiment of the inventive concepts.

The semiconductor light-emitting device 200 illustrated in FIG. 5 has substantially the same structure as the semiconductor light-emitting device 100 illustrated in FIG. 1 except that the semiconductor light-emitting device 200 includes a substrate 210 with an uneven pattern 212 formed in a surface facing the first conductive type semiconductor layer 130. Detailed descriptions of the substrate 210 are the same as descriptions of the substrate 110 with reference to FIG. 1.

The size of the uneven pattern 21 may be selected within a range of about 5 nm to about 500 μm. However, the inventive concepts are not limited thereto. The uneven pattern 21 may have any of various forms, such as a column shape, a triangular pyramid shape, a hemispherical shape, and like.

In some example embodiments, patterned sapphire substrate (PSS) surface processing technology, which etches a surface of the substrate 210 into a uniform shape and depth to change the roughness of the surface of the substrate 210, may be used to form the uneven pattern 21 in the surface of the substrate 210.

Since the uneven pattern 212 is formed in the surface of the substrate 210, the crystallizability of semiconductor layers that are formed on the substrate 210 is improved and defect density decreases, and thus, internal quantum efficiency may be improved. In addition, extraction efficiency may be increased due to the diffused reflection of light on the surface of the substrate 210, and thus, the light extraction efficiency of the semiconductor light-emitting device 200 may be improved.

Figure 6A:
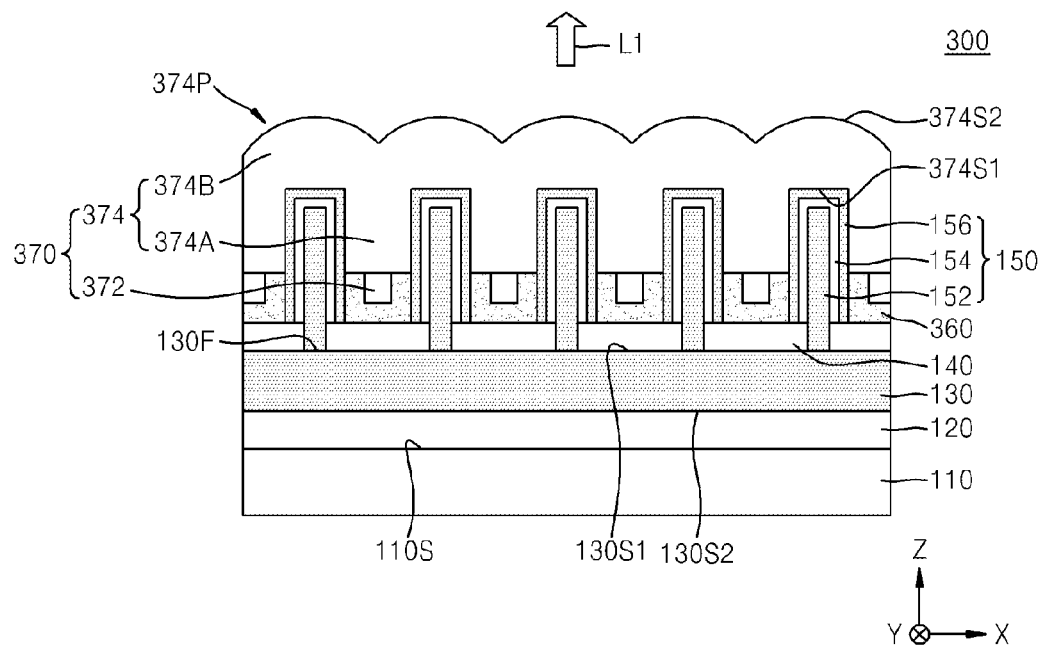
FIG. 6A is a cross-sectional view of a semiconductor light-emitting device according to some example embodiments of the inventive concepts.

FIG. 6A is a cross-sectional view of a semiconductor light-emitting device 300 according to another example embodiment of the inventive concepts.

The semiconductor light-emitting device 300 illustrated in FIG. 6A includes a substrate 110, a buffer layer 120, a first conductive type semiconductor layer 130, an insulating pattern 140, and a plurality of vertical type light-emitting structures 150, similar to the semiconductor light-emitting device 100 illustrated in FIG. 1.

However, the semiconductor light-emitting device 300 includes a transparent electrode layer 360 covering only a portion of a lower side of each of the plurality of vertical type light-emitting structures 150 and an insulation-filling layer 370 having a multi-layer structure, which is formed on the transparent electrode layer 360, unlike the semiconductor light-emitting device 100 illustrated in FIG. 1.

The insulation-filling layer 370 includes a first light-transmissive insulating layer 372 filling spaces between the plurality of vertical type light-emitting structures 150, and a second light-transmissive insulating layer 374 that is formed on the first light-transmissive insulating layer 372 and the transparent electrode layer 360 and covers an upper portion of each of the plurality of vertical type light-emitting structures 150. The second light-transmissive insulating layer 374 extends parallel to a main surface 130F of the first conductive type semiconductor layer 130.

The second light-transmissive insulating layer 374 includes a first portion 374A filling spaces between the plurality of vertical type light-emitting structures 150, and a second portion 374B that is integrally connected to the first portion 374A, is disposed on the first portion 374A, and extends parallel to the main surface 130F of the first conductive type semiconductor layer 130 so as to cover an upper portion of each of the plurality of vertical type light-emitting structures 150.

The first light-transmissive insulating layer 372 and the second light-transmissive insulating layer 374 may be formed of different materials selected from SOG, $SiO_2$, ZnO, SiN, $Al_2O_3$, and a combination thereof or the same material selected from them.

In some example embodiments, the first light-transmissive insulating layer 372 and the second light-transmissive insulating layer 374 may be formed of different materials having different refractive indices. According to a light extraction direction, the first light-transmissive insulating layer 372 may have a larger refractive index than the second light-transmissive insulating layer 374 and vice versa. The light extraction efficiency of the semiconductor light-emitting device 300 may be further improved by selecting the materials of the first and second light-transmissive insulating layers 372 and 374 so that each of the first and second light-transmissive insulating layers 372 and 374 provides a desired refractive index.

In the semiconductor light-emitting device 300, light generated from the plurality of vertical type light-emitting structures 150 penetrates the transparent electrode layer 360 and the insulation-filling layer 370 and is radiated externally in an arrow direction L1.

The second light-transmissive insulating layer 374 of the insulation-filling layer 370 includes a first surface 374S1 facing the plurality of vertical type light-emitting structures 150 and a second surface 374S2 that is opposite to the first surface 374S1 and is relatively distant from the plurality of vertical type light-emitting structures 150. The second surface 374S2 has a plurality of uneven portions 374P formed in a direction (X direction and/or Y direction in FIG. 1) that is parallel to the main surface 130F of the first conductive type semiconductor layer 130.

The first conductive type semiconductor layer 130 is positioned on the opposite side of a light transmission path of the arrow direction L1, centered on the plurality of vertical type light-emitting structures 150, and includes a first surface 130S1 (e.g., the main surface 130F) facing the plurality of vertical type light-emitting structures 150 and a second surface 130S2 that is opposite to the first surface 130S1 and is relatively distant from the plurality of vertical type light-emitting structures 150. The second surface 130S2 is flat in an extending direction (X direction and/or Y direction of FIG. 1) of the main surface 130F.

In the substrate 110 covering the second surface 130S2 of the first conductive type semiconductor layer 130 with the buffer layer 120 interposed therebetween, a surface 110S facing the first conductive type semiconductor layer 130 is flat.

Figure 6B:
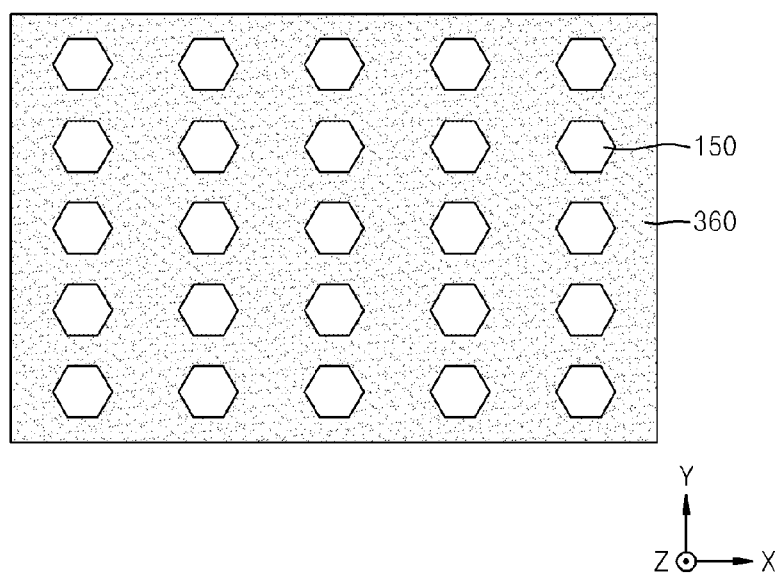
FIG. 6B is a plan view of a transparent electrode layer illustrated in FIG. 6A.

FIG. 6B is a plan view of the transparent electrode layer 360 illustrated in FIG. 6A.

In FIG. 6B, the transparent electrode layer 360 and the plurality of vertical type light-emitting structures 150 which are surrounded by the transparent electrode layer 360 are illustrated together. A horizontal cross-sectional shape of each of the plurality of nano cores 152 of the plurality of vertical type light-emitting structures 150 may be a hexagon. However, the inventive concepts are not limited thereto. In addition, although the plurality of vertical type light-emitting structures 150 illustrated in FIG. 6B are arranged linearly in the X direction and the Y direction and thus are disposed in a matrix form, the inventive concepts are not limited thereto. For example, the plurality of vertical type light-emitting structures 150 may be arranged in a zigzag form along at least one of the X direction and the Y direction.

Figure 7A:
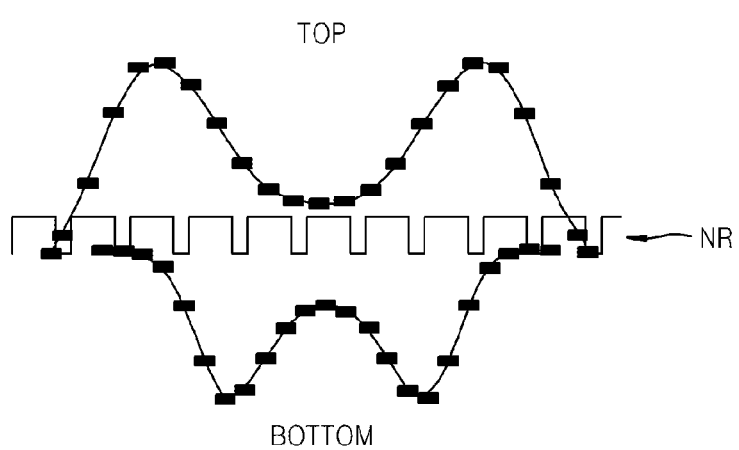
FIG. 7A is a diagram showing light distribution characteristics in a plurality of vertical type light-emitting structures including nano cores each having a nano rod shape.

FIG. 7A is a diagram showing light distribution characteristics in a plurality of vertical type light-emitting structures NR including nano cores each having a nano rod shape.

Figure 7B:
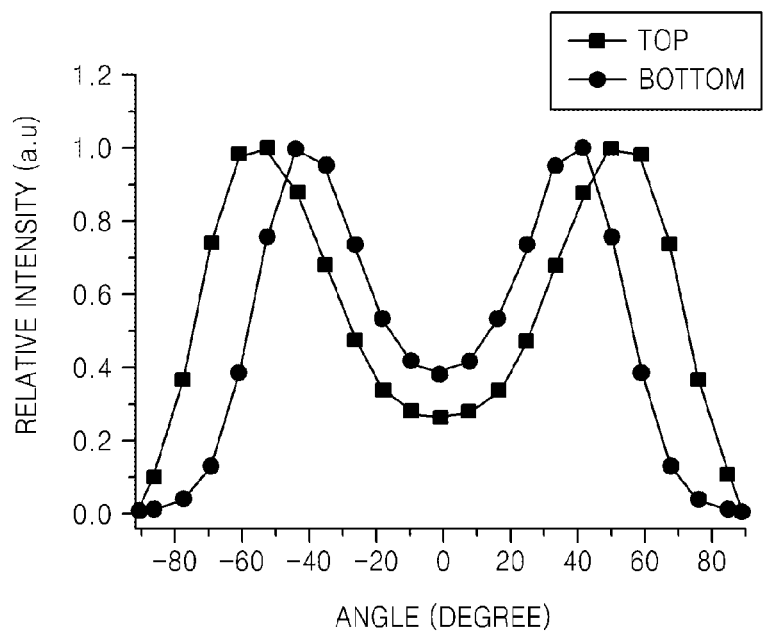
FIG. 7B is a graph showing relative light intensity according to emission angles in a top side and a bottom side of light that is emitted from the plurality of vertical type light-emitting structures used in the evaluation of FIG. 7A.

FIG. 7B is a graph showing relative light intensity according to emission angles in a top side TOP and a bottom side BOTTOM of light that is emitted from the plurality of vertical type light-emitting structures NR used in the evaluation of FIG. 7A.

Light generated from the 3D-shaped vertical type light-emitting structures NR including nano cores formed of column-shaped GaN nano rods of which a cross-sectional shape is a hexagon is emitted at a certain angle, as shown in FIG. 7A. As shown in FIGS. 7A and 7B, the emission angle of the light is different between the top side TOP and the bottom side BOTTOM of the plurality of vertical type light-emitting structures NR. Light emitted to the bottom side BOTTOM of the plurality of vertical type light-emitting structures NR moves through an upper medium having the same refractive index, whereas light emitted to the top side TOP of the plurality of vertical type light-emitting structures NR moves through a medium having different refractive indices. Thus, a traveling direction of the light emitted to the top side TOP is changed by an angle that is explained by Snell's law, and as a result, the light traveling to the top side TOP is incident on the upper medium at a lower angle than the light traveling to the bottom side BOTTOM. In this case, in order for the light incident on the upper medium to exit to air, the light has to be incident at an angle within total reflection due to a refractive index difference between two media through which the light penetrates. Accordingly, when the upper medium covering the plurality of vertical type light-emitting structures NR has a flat surface that extends parallel to an underlying substrate, for example, the substrate 110 of FIG. 1, the light emitted to the top side TOP of the plurality of vertical type light-emitting structures NR may not exit to the outside and may be totally reflected and then be returned to the inside of a chip.

In the semiconductor light-emitting devices according to the above example embodiments of the inventive concepts, for example, the semiconductor light-emitting device 100 illustrated in FIG. 1, the plurality of uneven portions 170P are formed in the second surface 170S2 of the insulation-filling layer 170 in a direction (X direction and/or Y direction in FIG. 1) that is parallel to the main surface 130F of the first conductive type semiconductor layer 130. The insulation-filling layer 170 is disposed on a light transmission path for radiating light generated from the plurality of vertical type light-emitting structures 150 to the outside, and the second surface 170S2 of the insulation-filling layer 170 is more distant from the plurality of vertical type light-emitting structures 150 than the first surface 170S1 of the insulation-filling layer 170. Accordingly, light emitted to the top side of the plurality of vertical type light-emitting structures NR is not returned to the inside of the chip, and light exiting to the outside of the top side increases. Thus, light extraction efficiency may be improved.

Figure 7C:
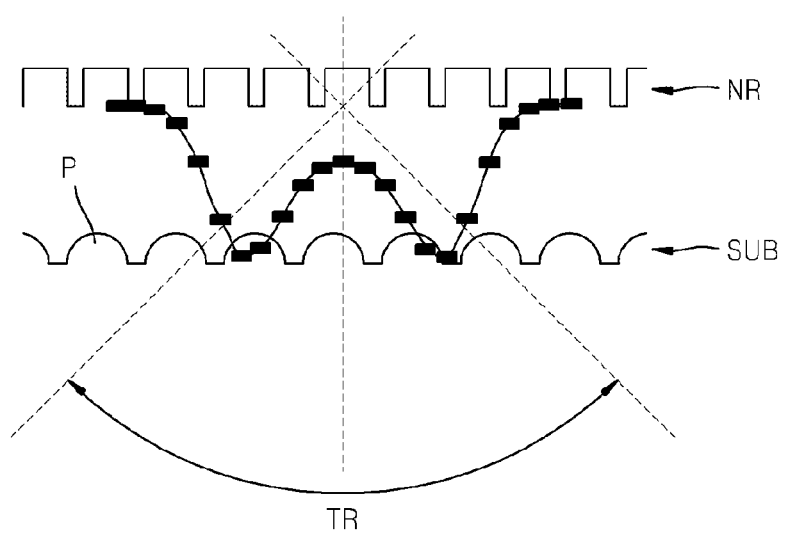
FIG. 7C is a diagram showing light distribution characteristics in a plurality of vertical type light-emitting structures formed on a transparent substrate.

FIG. 7C is a diagram showing light distribution characteristics in a plurality of vertical type light-emitting structures NR formed on a transparent substrate SUB, for example, a sapphire substrate.

Referring to FIG. 7C, light emitting to a bottom side of the plurality of vertical type light-emitting structures NR may mostly pass through the transparent substrate SUB. Accordingly, whether a substrate of the transparent substrate SUB includes a 3D uneven structure P may not have a great influence on light extraction efficiency. Since the plurality of vertical type light-emitting structures NR having a 3D uneven structure may function as an uneven structure, a possibility that light is trapped in nano cores is low. Accordingly, in a semiconductor light-emitting device, including the transparent substrate SUB disposed under the plurality of vertical type light-emitting structures NR, a case where a structure having a surface with the uneven pattern 212 formed therein is used like the substrate 210 of the semiconductor light-emitting device 200 illustrated in FIG. 5 and a case where a structure having the flat surface 110S is used like the substrate 110 of the semiconductor light-emitting device 100 illustrated in FIG. 1 may obtain constant light extraction efficiency.

Figure 8:
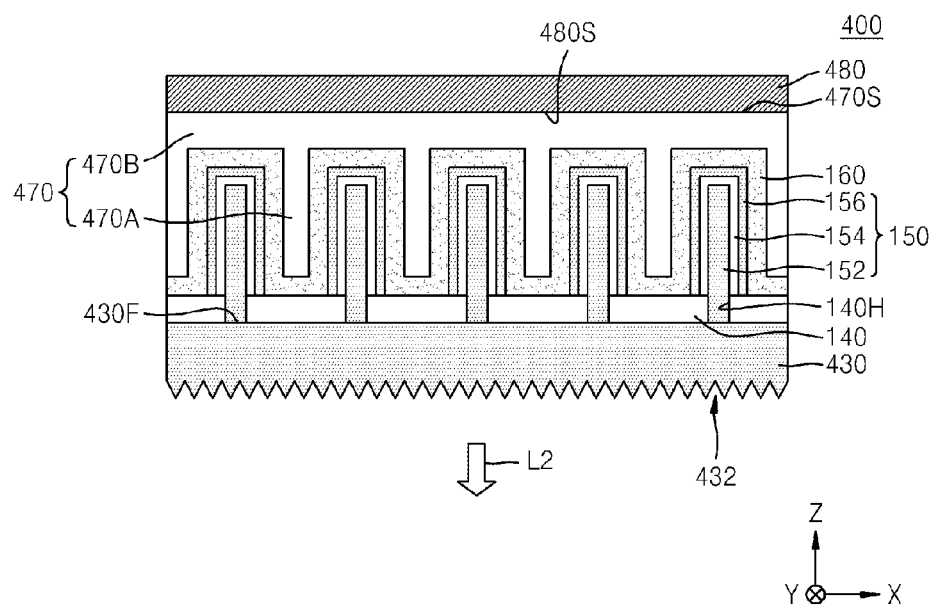
FIG. 8 is a cross-sectional view of a semiconductor light-emitting device according to some example embodiments of the inventive concepts.

FIG. 8 is a cross-sectional view of a semiconductor light-emitting device 400 according to another example embodiment of the inventive concepts.

Referring to FIG. 8, the semiconductor light-emitting device 400 includes a first conductive type semiconductor layer 430, a plurality of vertical type light-emitting structures 150 formed on the first conductive type semiconductor layer 430, a transparent electrode layer 160 covering at least a portion of each of the plurality of vertical type light-emitting structures 150, and an insulation-filling layer 470 formed on the transparent electrode layer 160.

In the first conductive type semiconductor layer 430, an uneven pattern 432 is formed on a surface that is opposite to a surface facing the plurality of vertical type light-emitting structures 150. The uneven pattern 432 may include a pattern having a regular form or a pattern having an irregular form.

In the semiconductor light-emitting device 400, light generated from the plurality of vertical type light-emitting structures 150 penetrates an insulating pattern 140 and the first conductive type semiconductor layer 430 and is radiated externally in an arrow direction L2.

The first conductive type semiconductor layer 430 is disposed on a path for radiating the light generated from the plurality of vertical type light-emitting structures 150 to the outside, and the uneven pattern 432 is formed in a surface of the first conductive type semiconductor layer 430, which is relatively far from the plurality of vertical type light-emitting structures 150. Accordingly, the amount of light radiated externally from among light generated from an active layer 154 may be increased, thereby suppressing optical loss and improving brightness.

The insulation-filling layer 470 includes a first portion 470A filling spaces between the plurality of vertical type light-emitting structures 150, and a second portion 470B that is integrally connected to the first portion 470A, is disposed on the first portion 470A, and extends parallel to a main surface 430F of the first conductive type semiconductor layer 430 so as to cover an upper portion of each of the plurality of vertical type light-emitting structures 150.

Descriptions of the insulation-filling layer 470 are substantially the same those of the insulation-filling layer 170 with reference to FIG. 1 and thus repeated descriptions thereof are not provided. However, the insulation-filling layer 470 of the semiconductor light-emitting device 400 illustrated in FIG. 8 is disposed in the opposite side of a path for radiating light generated from the plurality of vertical type light-emitting structures 150 to the outside, and a surface 470S of the insulation-filling layer 470, which is relatively far from the plurality of vertical type light-emitting structures 150, is flat in a direction (X direction and/or Y direction of FIG. 8) that is parallel to the main surface 430F of the first conductive type semiconductor layer 430.

A reflective electrode layer 480 extending parallel to the main surface 430F of the first conductive type semiconductor layer 430 is formed on the insulation-filling layer 470. The reflective electrode layer 480 has a flat surface 480S facing the plurality of vertical type light-emitting structures 150.

The flat surface 480S of the reflective electrode layer 480 extends flat in a direction (X direction and/or Y direction of FIG. 8) that is parallel to the main surface 430F of the first conductive type semiconductor layer 430.

As a comparison example, when the surface 480S of the reflective electrode layer 480, which faces the plurality of vertical type light-emitting structures 150, is not flat unlike in FIG. 8, for example, when the reflective electrode layer 480 includes a protruding portion extending up to spaces between the plurality of vertical type light-emitting structures 150, the surface 480S of the reflective electrode layer 480, which faces the plurality of vertical type light-emitting structures 150, has a 3D structure. Thus, the number of light reflections in the reflective electrode layer 480 increases. The reflectivity of metal in a visible region is about 90%. Thus, when the number of light reflections in the reflective electrode layer 480 increases, relatively large light loss is caused thereby, and as a result, light extraction efficiency may be lowered. Accordingly, a structure that may minimize the number of light reflections in the reflective electrode layer 480 is required. In an embodiment, the surface 480S of the reflective electrode layer 480, which faces the plurality of vertical type light-emitting structures 150, extends flat in an extending direction of the main surface 430F of the first conductive type semiconductor layer 430.

Although the reflective electrode layer 480 of FIG. 8 directly contacts the insulation-filling layer 470, the inventive concepts are not limited thereto. For example, another insulating layer may be further interposed between the reflective electrode layer 480 and the insulation-filling layer 470. Other specific examples in which another insulating layer is further interposed between the reflective electrode layer 480 and the insulation-filling layer 470 will be described with reference to FIGS. 12 to 14 and 16 later.

The reflective electrode layer 480 may be formed of Ag, Al, Ni, Cr, Pd, Cu, Pt, Sn, W, Au, Rh, Ir, Ru, Mg, Zn, or a combination or alloy thereof. In some example embodiments, the reflective electrode layer 480 may have a multi-layer structure including at least two types of metals, such as Ni/Ag, Zn/Ag, Ni/Al, Zn/Al, Pd/Ag, Pd/Al, Ir/Ag, Ir/Au, Pt/Ag, Pt/Al, or Ni/Ag/Pt.

Figure 9A:
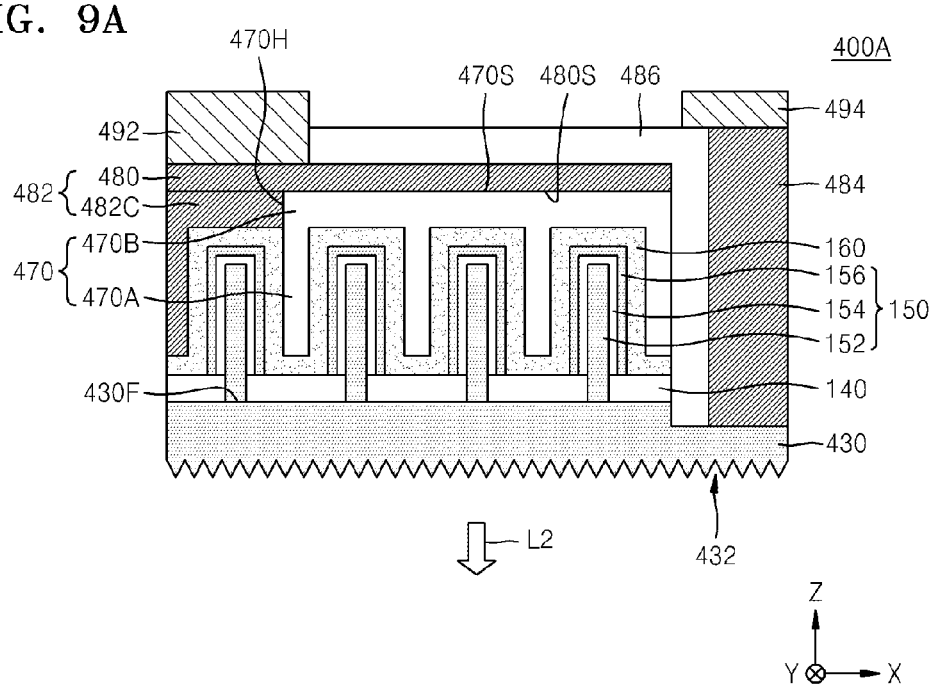
FIG. 9A is a cross-sectional view of a semiconductor light-emitting device according to some example embodiments of the inventive concepts.

FIG. 9A is a cross-sectional view of a semiconductor light-emitting device 400A according to another example embodiment of the inventive concepts.

The semiconductor light-emitting device 400A illustrated in FIG. 9A includes the structure of the semiconductor light-emitting device 400 of FIG. 8. The semiconductor light-emitting device 400A includes a first electrode 482 including a reflective electrode layer 480 connected to a second conductive type semiconductor layer 156 of a plurality of vertical type light-emitting structures 150, and a second electrode 484 connected to a first conductive type semiconductor layer 430. Both the first electrode 482 and the second electrode 484 face a direction opposite to a light-emitting direction indicated as an arrow L2 in which light generated from the plurality of vertical type light-emitting structures 150 is radiated externally, based on the plurality of vertical type light-emitting structures 150. That is, the first electrode 482 and the second electrode 484 are disposed opposite to the first conductive type semiconductor layer 430 with the plurality of vertical type light-emitting structures 150 interposed therebetween.

In the semiconductor light-emitting device 400A, the first electrode 482 may further include a contact 482C penetrating the insulation-filling layer 470. The reflective electrode layer 480 may be connected to a transparent electrode layer 160 via the contact 482C.

In some example embodiments, the contact 482C and the reflective electrode layer 480 may be integrally connected to each other. In some example embodiments, the contact 482C and the reflective electrode layer 480 may be formed as separate elements, and an interface may exist therebetween.

The first electrode 482 and the second electrode 484 are separate from each other with a passivation layer 486 therebetween. In addition, the transparent electrode layer 160 and the second electrode 484 are separate from each other with the passivation layer 486 therebetween. The passivation layer 486 may protect the first conductive type semiconductor layer 430, a plurality of vertical type light-emitting structures 150, the transparent electrode layer 160, and the insulation-filling layer 470 from an external environment. The passivation layer 486 may be formed of silicon oxide, silicon nitride, or a combination thereof. However, the inventive concepts are not limited thereto.

A first electrode pad 492 and a second electrode pad 494 are formed on the first electrode 482 and the second electrode 484, respectively.

Descriptions of the materials of the first electrode 482, the second electrode 484, the first electrode pad 492, and the second electrode pad 494 are substantially the same as those of the first electrode 182 and the second electrode 184 with reference to FIG. 2A and thus are not repeatedly provided.

The processes described with reference to FIGS. 3A to 3G may be similarly used to manufacture the semiconductor light-emitting device 400A illustrated in FIG. 9A. In connection with the formation of the first electrode 482, the insulation-filling layer 470 may be formed, and before forming the reflective electrode layer 480, a portion of the insulation-filling layer 470 may be etched to form a contact hole 470H exposing the transparent electrode layer 160 and the contact hole 470H may be filled with a conductive material. Thus, the contact 482C may be formed. Then, the reflective electrode layer 480 may be formed on the contact 482C and the insulation-filling layer 470, and a mask pattern in which an opening having a predetermined shape is formed may be formed on the reflective electrode layer 480. The opening of the mask pattern may be formed to correspond to a region in which the second electrode 484 is to be formed. The reflective electrode layer 480, the insulation-filling layer 470, the transparent electrode layer 160, the plurality of vertical type light-emitting structures 150, and the insulating pattern 140 each may be partially mesa-etched by using the mask pattern as an etch mask to expose an area of the first conductive type semiconductor layer 430, and then the mask pattern used as the etch mask may be removed. In this case, a portion of the first conductive type semiconductor layer 430 may be also etched due to over-etch in the mesa etching process. After forming the passivation layer 486 covering the mesa-etched resultant structure, removing a portion of the passivation layer 486 to expose a portion of the reflective electrode layer 480 and a portion of the first conductive type semiconductor layer 430, and forming the second electrode 484 on the exposed portion of the first conductive type semiconductor layer 430, the first electrode pad 492 and the second electrode pad 494 may be formed on the exposed portions of the reflective electrode layer 480 and the second electrode 484, respectively.

Figure 9B:
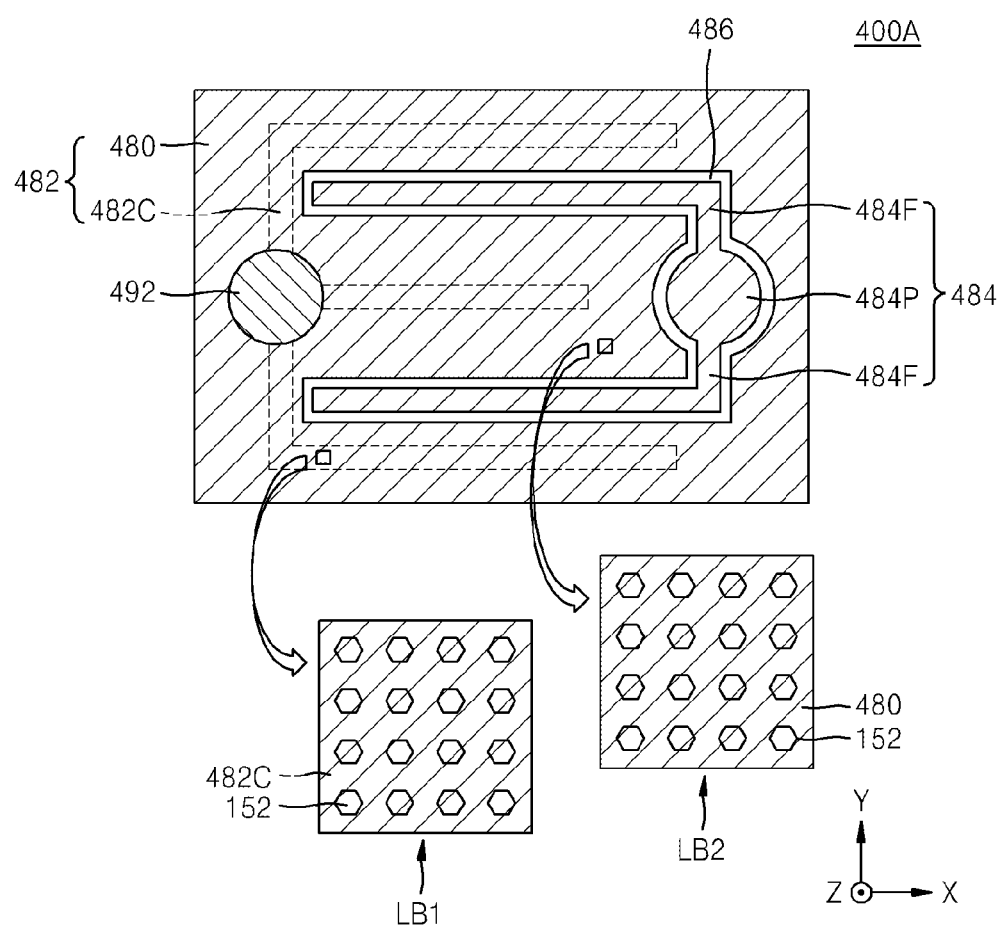
FIG. 9B is a plan view of a planar structure of first and second electrodes disposed in the semiconductor light-emitting device illustrated in FIG. 9A according to some example embodiments of the inventive concepts.

FIG. 9B is a plan view of a planar structure of the first and second electrodes 482 and 484 which is disposed in the semiconductor light-emitting device 400A illustrated in FIG. 9A according to an example embodiment of the inventive concepts.

The transparent electrode layer 160 illustrated in FIG. 9A may have a planar shape that is substantially similar to that of the reflective electrode layer 480 of the first electrode 482 illustrated in FIG. 9B.

Referring to FIG. 9B, the reflective electrode layer 480 of the first electrode 482 is formed to cover an area of a main surface 430F (refer to FIG. 9A) of the first conductive type semiconductor layer 430, except for an area of the main surface 430F covered with the second electrode 484 and a peripheral area thereof. The contact 482C of the first electrode 482 may have a planar structure that is similar to that described with respect to the first electrode 182 with reference to FIG. 2B.

The second electrode 484 may be a finger-type electrode. The second electrode 484 may include at least one second electrode pad 484P formed on the main surface 430F of the first conductive type semiconductor layer 430 and at least one second electrode finger 484F that is connected to the at least one second electrode pad 484P and is branched off from the at least one second electrode pad 484P to extend therefrom. The second electrode pad 484P may be disposed in a position corresponding to the second electrode pad 494 illustrated in FIG. 9A.

Although the second electrode 484 of FIG. 9B includes one second electrode pad 484P and two second electrode fingers 484F, the inventive concepts are not limited thereto.

A magnified local area LB1, in which nano cores 152 of the plurality of vertical type light-emitting structures 150 are covered with the transparent electrode layer 160, the contact 482C, and the reflective electrode layer 480, and a magnified local area LB2, in which the nano cores 152 are covered with the transparent electrode layer 160 and the reflective electrode layer 480 but not covered with the contact 482C, are shown in FIG. 9B.

Although a horizontal cross-sectional shape of each of the plurality of nano cores 152 illustrated in FIG. 9B is a hexagon, the inventive concepts are not limited thereto. In addition, although the plurality of nano cores 152 illustrated in FIG. 9B are arranged linearly in the X direction and the Y direction and thus are disposed in a matrix form, the inventive concepts are not limited thereto. For example, the plurality of nano cores 152 may be arranged in a zigzag form along at least one of the X direction and the Y direction.

Figure 10:
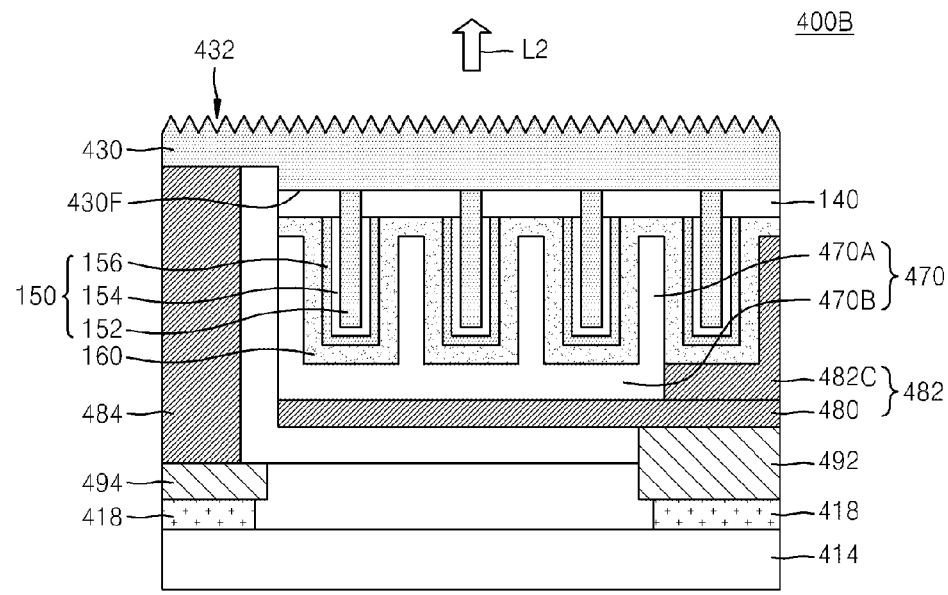
FIG. 10 is a cross-sectional view of a semiconductor light-emitting device according to some example embodiments of the inventive concepts.

FIG. 10 is a cross-sectional view of a semiconductor light-emitting device 400B according to another example embodiment of the inventive concepts.

As illustrated in FIG. 10, the semiconductor light-emitting device 400A may be flip chip mounted on a sub-mount 414 by using a bonding conductive layer 418.

The bonding conductive layer 418 may have a single-layer structure formed of a material selected from the group consisting of Au, Sn, Ni, Pb, Ag, In, Cr, Ge, Si, Ti, W, Pt, and an alloy including at least two thereof, or a multi-layer structure formed of a combination thereof. In some example embodiments, the bonding conductive layer 418 may include an Au—Sn alloy, an Ni—Sn alloy, an Ni—Au—Sn alloy, a Pb—Ag—In alloy, a Pb—Ag—Sn alloy, a Pb—Sn alloy, an Au—Ge alloy, or an Au—Si alloy.

Figure 11A:
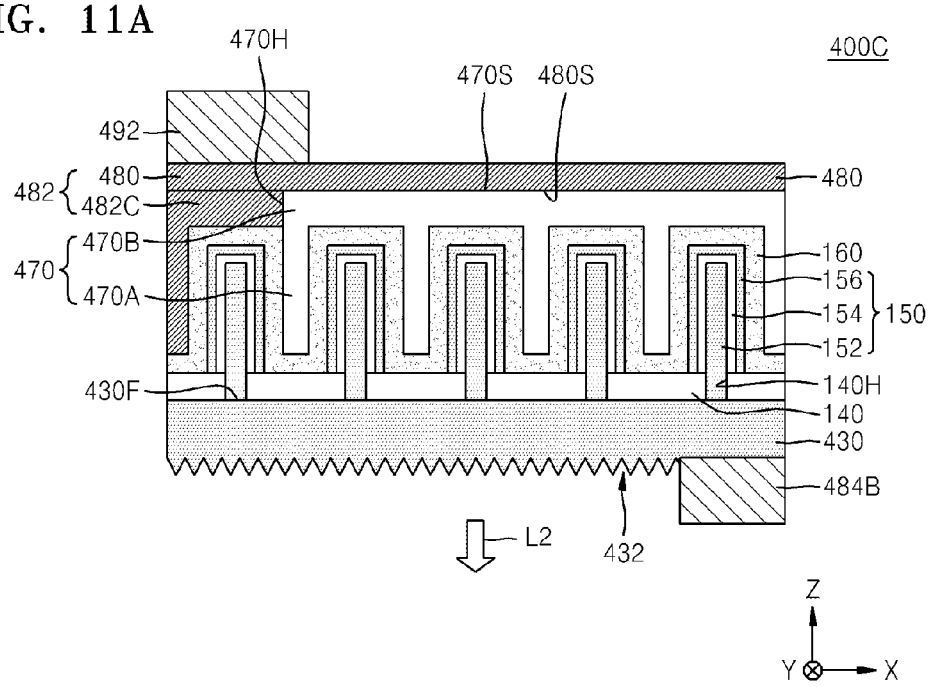
FIG. 11A is a cross-sectional view of a semiconductor light-emitting device according to some example embodiments of the inventive concepts.

FIG. 11A is a cross-sectional view of a semiconductor light-emitting device 400C according to another example embodiment of the inventive concepts.

The semiconductor light-emitting device 400C illustrated in FIG. 11A includes the structure of the semiconductor light-emitting device 400 of FIG. 8. In the semiconductor light-emitting device 400C, a first electrode 482, which includes the reflective electrode layer 480 which is connected to the second conductive type semiconductor layer 156 of each of the plurality of vertical type light-emitting structures 150, is disposed at the opposite side of a direction (direction of an arrow L2) in which light generated from the plurality of vertical type light-emitting structures 150 is radiated externally, based on the plurality of vertical type light-emitting structures 150. That is, the first electrode 482 is disposed at the opposite side of the first conductive type semiconductor layer 430 with the plurality of vertical type light-emitting structures 150 interposed therebetween.

A second electrode 484B that is connected to the first conductive type semiconductor layer 430 is disposed at the opposite side of the first electrode 482 with the plurality of vertical type light-emitting structures 150 interposed therebetween.

In the semiconductor light-emitting device 400C illustrated in FIG. 11A, the processes described with reference to FIG. 9A may be similarly used to form the first electrode 482 and a first electrode pad 492. The second electrode 484B may be formed before or after forming the first electrode 482, which includes the reflective electrode layer 480, and the first electrode pad 492.

Figure 11B:
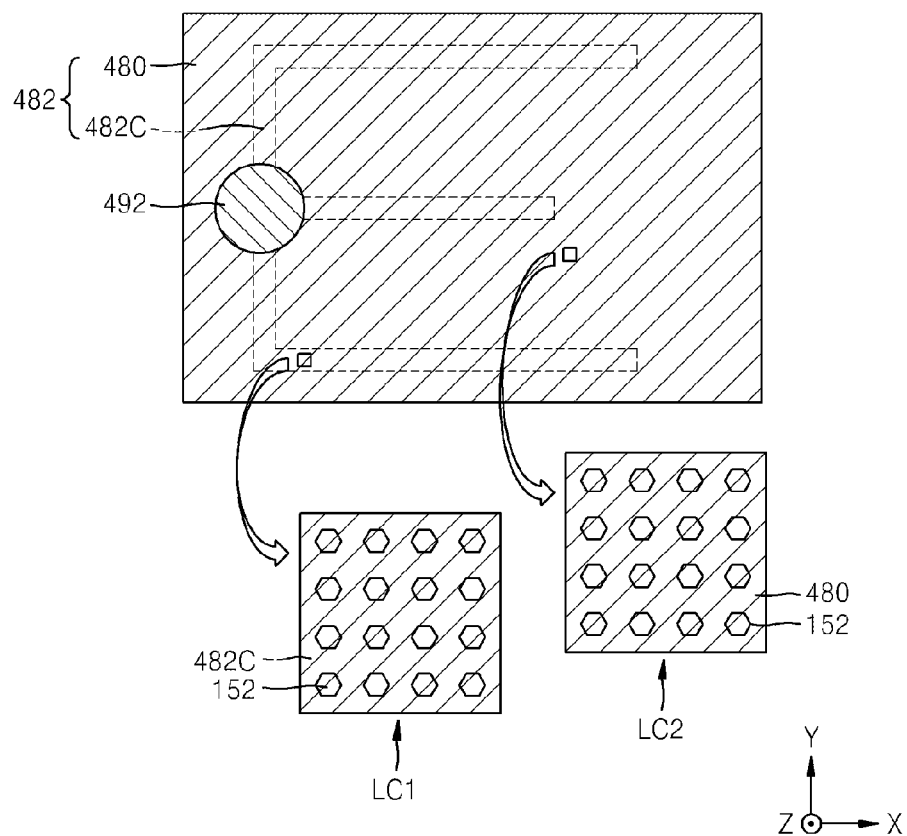
FIG. 11B is a plan view of a planar structure of a first electrode disposed in the semiconductor light-emitting device illustrated in FIG. 11A according to some example embodiments of the inventive concepts.

FIG. 11B is a plan view of a planar structure of the first electrode 482 which is disposed in the semiconductor light-emitting device 400C illustrated in FIG. 11A according to an example embodiment of the inventive concepts.

The transparent electrode layer 160 illustrated in FIG. 11A may have a planar shape that is substantially similar to that of the reflective electrode layer 480 of the first electrode 482 illustrated in FIG. 11B.

Referring to FIG. 11B, planar structures of the first electrode 482 and the first electrode pad 492 of the semiconductor light-emitting device 400C are substantially the same as those of the first electrode 482 and the first electrode pad 492, described with reference to FIG. 9B. However, unlike in FIG. 9B, the reflective electrode layer 480 of the first electrode 482 may extend on the plurality of vertical type light-emitting structures 150 so as to completely cover a main surface 430F of the first conductive type semiconductor layer 430.

A magnified local area LC1, in which nano cores 152 of the plurality of vertical type light-emitting structures 150 are covered with the transparent electrode layer 160, the contact 482C, and the reflective electrode layer 480, and a magnified local area LC2, in which the nano cores 152 are covered with the transparent electrode layer 160 and the reflective electrode layer 480 but not covered with the contact 482C, are shown in FIG. 11B.

Although a horizontal cross-sectional shape of each of the plurality of nano cores 152 illustrated in FIG. 11B is a hexagon, the inventive concepts are not limited thereto. Although the plurality of nano cores 152 illustrated in FIG. 11B are arranged linearly in the X direction and the Y direction and thus are disposed in a matrix form, the inventive concepts are not limited thereto. For example, the plurality of nano cores 152 may be arranged in a zigzag form along at least one of the X direction and the Y direction.

Figure 11C:
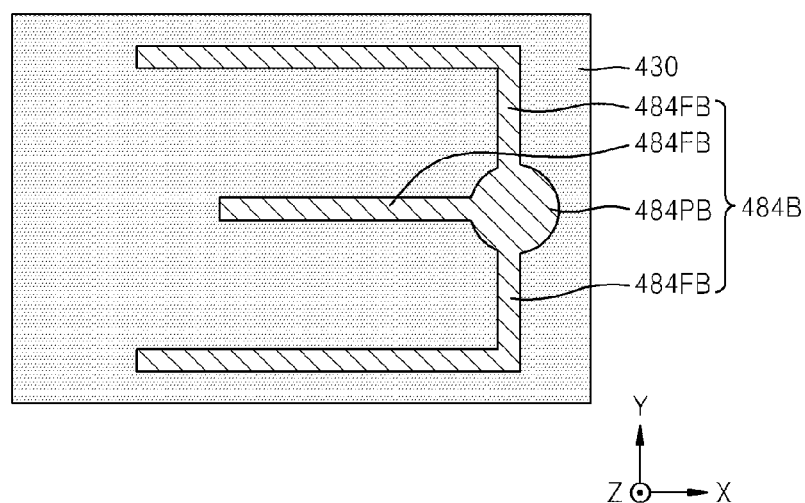
FIG. 11C is a plan view of a planar structure of a second electrode disposed in the semiconductor light-emitting device illustrated in FIG. 11A according to some example embodiments of the inventive concepts.

FIG. 11C is a plan view of a planar structure of the second electrode 484B which is disposed in the semiconductor light-emitting device 400C illustrated in FIG. 11A according to an example embodiment of the inventive concepts.

The second electrode 484B may be a finger-type electrode. The second electrode 484B may include at least one second electrode pad 484PB formed on a surface that is opposite to the main surface 430F of the first conductive type semiconductor layer 430 and has an uneven pattern 432 formed therein, and at least one second electrode finger 484FB that is connected to the at least one second electrode pad 484PB and is branched off from the at least one second electrode pad 484PB to extend on the surface having the uneven pattern 432.

Although the second electrode 484B of FIG. 11C includes one second electrode pad 484PB and three second electrode fingers 484FB, the inventive concepts are not limited thereto.

Figure 12:
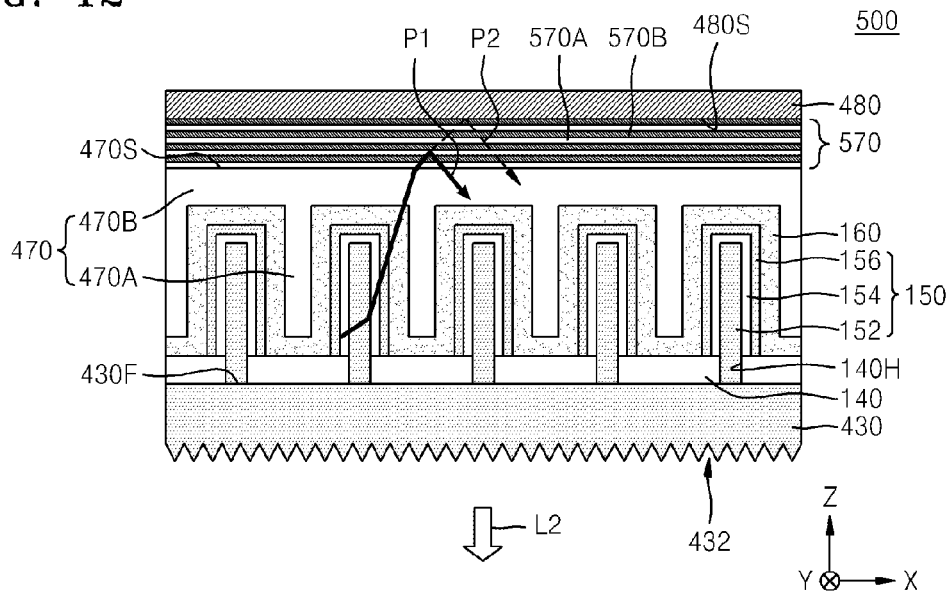
FIGS. 12 to 17 each are a cross-sectional view of a semiconductor light-emitting device according to some example embodiments of the inventive concepts.

FIG. 12 is a cross-sectional view of a semiconductor light-emitting device 500 according to another example embodiment of the inventive concepts.

The semiconductor light-emitting device 500 illustrated in FIG. 12 has substantially the same structure as the semiconductor light-emitting device 400 of FIG. 8 except that the semiconductor light-emitting device 500 further includes an insulating reflective layer 570 between an insulation-filling layer 470 and a reflective electrode layer 480 having a flat surface 480S.

The insulating reflective layer 570 may be disposed between the insulation-filling layer 470 and the reflective electrode layer 480 and may reflect at least a portion of light radiated around the reflective electrode layer 480 from among light generated from an active layer 154 of each of a plurality of vertical type light-emitting structures 150. Before the light generated from the plurality of vertical type light-emitting structures 150 reaches the reflective electrode layer 480 in a path of light radiated toward the reflective electrode layer 480, the insulating reflective layer 570 may reflect the light in a direction that becomes more distant from the reflective electrode layer 480, for example, a direction indicated by an arrow P1.

As a comparison example, in the case where the reflective electrode layer 480 is formed of metal and the light generated from the plurality of vertical type light-emitting structures 150 reaches the reflective electrode layer 480 in a path of light radiated toward the reflective electrode layer 480 and then is reflected from a surface of the reflective electrode layer 480 in a direction indicated by an arrow P2, relatively large light loss is caused when the number of reflections by the reflective electrode layer 480 increases, since the reflectivity of the metal is about 90%. As a result, light extraction efficiency may be lowered.

The semiconductor light-emitting device 500 may minimize the number of reflections by the reflective electrode layer 480 by including the insulating reflective layer 570, which may reflect light in a direction, which becomes more distant from the reflective electrode layer 480, before the light reaches the reflective electrode layer 480 in a path of the light radiated toward the reflective electrode layer 480. Accordingly, light extraction efficiency may be improved.

The insulating reflective layer 570 may be disposed on the plurality of vertical type light-emitting structures 150 and may extend parallel to the main surface 430F of the first conductive type semiconductor layer 430.

The insulating reflective layer 570 may be formed of a transparent material. In some example embodiments, the insulating reflective layer 570 may have a multi-layer structure in which at least two materials having different refractive indices are alternately stacked. For example, the insulating reflective layer 570 may have a structure in which at least two kinds of oxides, nitrides, or nitride semiconductors having different refractive indices are alternately and repeatedly stacked at least two times. For example, the insulating reflective layer 570 may have an omni-directional reflector (ODR) structure or a distributed Bragg reflector (DBR) structure.

The insulating reflective layer 570 may include a multi-reflective layer having an insulating structure in which a first layer 570A and a second layer 570B, which have different refractive indices, are alternately stacked at least one time.

The first layer 570A and the second layer 570B each may have a thickness of ¼ of a wavelength (λ) of light generated from the active layer 154. The first layer 570A and the second layer 570B each may be formed of any one oxide or nitride selected from the group consisting of Si, Zr, Ta, Ti, Hf, and Al.

In some example embodiments, the first layer 570A and the second layer 570B, which constitute the insulating reflective layer 570, each may be formed of a material selected from the group consisting of $SiO_x$ (0<x≤2), $TiO_2$, $Ti_3O_5$, $Ti_2O_3$, TiO, $Ta_2O_5$, $ZrO_2$, $Nb_2O_5$, $CeO_2$, ZnS, $Al_2O_3$, SiN, siloxane polymers, and $MgF_2$. In some example embodiments, the insulating reflective layer 570 may have a multi-layer structure in which a high refractive index layer and a low refractive index layer, which are formed of a material selected from among the above-stated materials, are alternately repeated 2 to 60 times. For example, the insulating reflective layer 570 may have a $SiO_2/Nb_2O_5$ multi-layer structure or a $TiO_2/SiO_2$ multi-layer structure.

Figure 13:
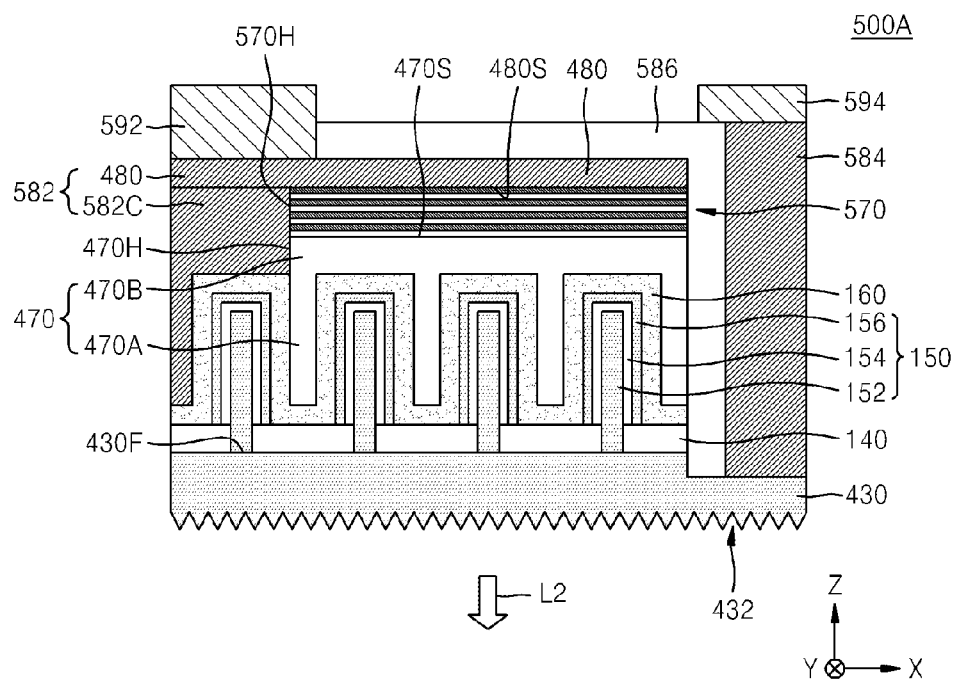

FIG. 13 is a cross-sectional view of a semiconductor light-emitting device 500A according to another example embodiment of the inventive concepts.

The semiconductor light-emitting device 500A illustrated in FIG. 13 includes the structure of the semiconductor light-emitting device 500 of FIG. 12. The semiconductor light-emitting device 500A includes a first electrode 582 including a reflective electrode layer 480 connected to a second conductive type semiconductor layer 156 of a plurality of vertical type light-emitting structures 150, and a second electrode 584 connected to a first conductive type semiconductor layer 430. The first electrode 582 and the second electrode 584 each are disposed to face an opposite direction of a direction (direction of an arrow L2) in which light generated from the plurality of vertical type light-emitting structures 150 is radiated externally, based on the plurality of vertical type light-emitting structures 150. That is, the first electrode 582 and the second electrode 584 are disposed at the opposite side of the first conductive type semiconductor layer 430 with the plurality of vertical type light-emitting structures 150 interposed therebetween.

In the semiconductor light-emitting device 500A, the first electrode 582 may further include a contact 582C that penetrates a contact hole 470H formed in an insulation-filling layer 470 and a contact hole 570H formed in an insulating reflective layer 570 and is connected to a transparent electrode layer 160. The reflective electrode layer 480 may be connected to the transparent electrode layer 160 via the contact 582C.

In some example embodiments, the contact 582C and the reflective electrode layer 480 may be integrally connected to each other. In some example embodiments, the contact 582C and the reflective electrode layer 480 may be formed as separate elements, and an interface may exist therebetween.

The first electrode 582 and the second electrode 584 are separate from each other with a passivation layer 586 therebetween. The passivation layer 586 may protect the first conductive type semiconductor layer 430, a plurality of vertical type light-emitting structures 150, the transparent electrode layer 160, the insulation-filling layer 470, and the insulating reflective layer 570 from an external environment. The passivation layer 586 may be formed of silicon oxide, silicon nitride, or a combination thereof. However, the inventive concepts are not limited thereto.

A first electrode pad 592 and a second electrode pad 594 are formed on the first electrode 582 and the second electrode 584, respectively.

Descriptions of the first electrode 582, the second electrode 584, the first electrode pad 592, and the second electrode pad 594 are substantially the same as those of the first electrode 482, the second electrode 484, the first electrode pad 492, and the second electrode pad 494 with reference to FIG. 9A and FIG. 9B and thus are not repeatedly provided.

Figure 14:
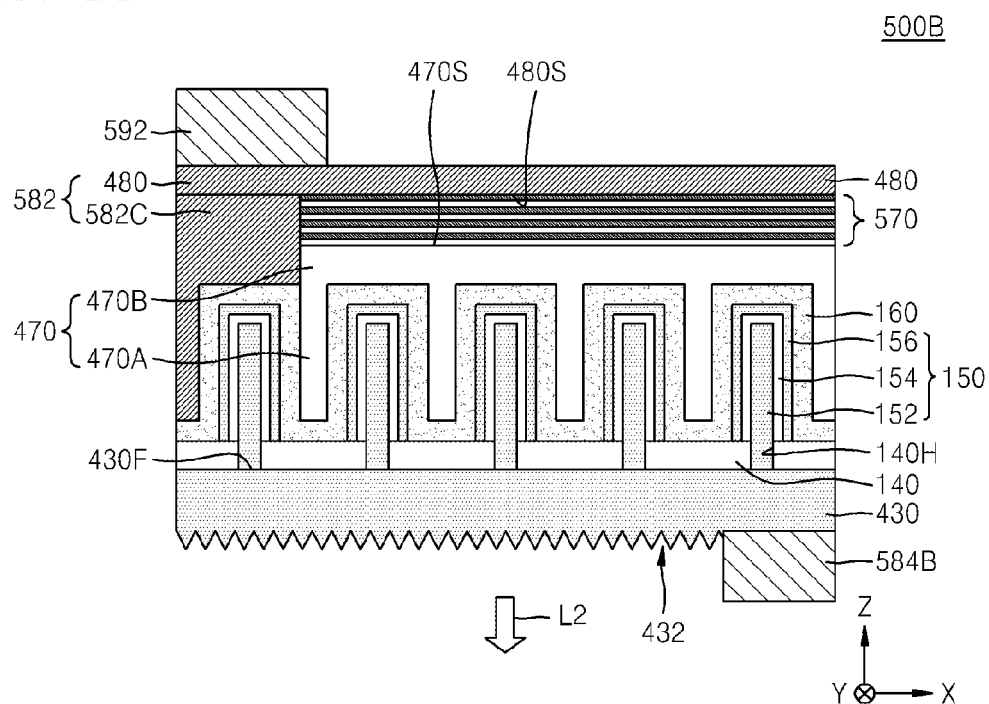

FIG. 14 is a cross-sectional view of a semiconductor light-emitting device 500B according to another example embodiment of the inventive concepts.

The semiconductor light-emitting device 500B illustrated in FIG. 14 includes the structure of the semiconductor light-emitting device 500 of FIG. 12. In the semiconductor light-emitting device 500B, a first electrode 582, which includes the reflective electrode layer 480 which is connected to the second conductive type semiconductor layer 156 of each of the plurality of vertical type light-emitting structures 150, is disposed at the opposite side of a direction (direction of an arrow L2) in which light generated from the plurality of vertical type light-emitting structures 150 is radiated externally, based on the plurality of vertical type light-emitting structures 150. That is, the first electrode 582 is disposed at the opposite side of the first conductive type semiconductor layer 430 with the plurality of vertical type light-emitting structures 150 interposed therebetween.

A second electrode 584B that is connected to the first conductive type semiconductor layer 430 is disposed at the opposite side of the first electrode 582 with the plurality of vertical type light-emitting structures 150 interposed therebetween.

Descriptions of the second electrode 584B illustrated in FIG. 14 are substantially the same as those of the second electrode 484B with reference to FIG. 11A and FIG. 11B and thus are not repeatedly provided.

Figure 15:
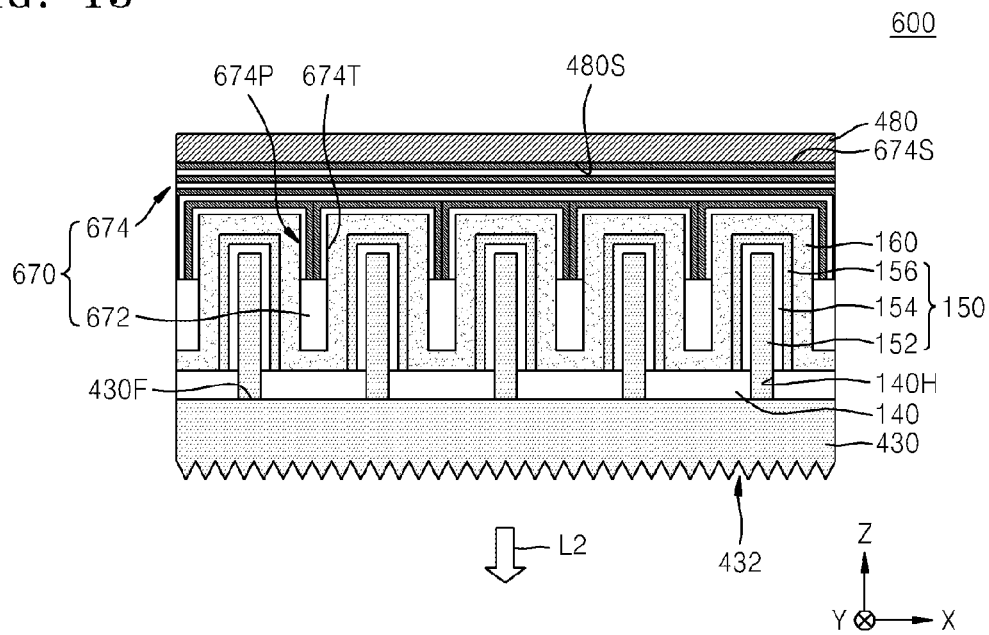

FIG. 15 is a cross-sectional view of a semiconductor light-emitting device 600 according to another example embodiment of the inventive concepts.

The semiconductor light-emitting device 600 has a structure that is substantially similar to that of the semiconductor light-emitting device 400 illustrated in FIG. 8. However, unlike the insulation-filling layer 470 illustrated in FIG. 8, an insulation-filling layer 670 of the semiconductor light-emitting device 600 includes a light-transmissive insulating layer 672 covering only a portion of each of a plurality of vertical type light-emitting structures 150 between the plurality of vertical type light-emitting structures 150, and an insulating reflective layer 674 interposed between the light-transmissive insulating layer 672 and a reflective electrode layer 480.

The insulating reflective layer 674 of the insulation-filling layer 670 is disposed on the light-transmissive insulating layer 672 and extends parallel to a main surface 430F of a first conductive type semiconductor layer 430 so as to cover a top portion of each of the plurality of vertical type light-emitting structures 150.

A transparent electrode layer 160 is interposed between the plurality of vertical type light-emitting structures 150 and the insulation-filling layer 670.

The light-transmissive insulating layer 672 may be formed of SOG, $SiO_2$, ZnO, SiN, $Al_2O_3$, or a combination thereof.

The insulating reflective layer 674 may have a structure that is substantially the same as that of the insulating reflective layer 570 described with reference to FIG. 12. However, the insulating reflective layer 674 includes a plurality of step portions 674T corresponding to step portions formed in an upper surface of the transparent electrode layer 160 at an area adjacent to an upper portion of each of the plurality of vertical type light-emitting structures 150. Due to the plurality of step portions 674T, the insulating reflective layer 674 includes a plurality of protruding portions 674P extending into spaces between the plurality of vertical type light-emitting structures 150.

The insulating reflective layer 674 is disposed in the opposite side of a path for radiating light generated from the plurality of vertical type light-emitting structures 150 to the outside, and a surface 674S of the insulating reflective layer 674, which is relatively far from the plurality of vertical type light-emitting structures 150, is flat in a direction (X direction and/or Y direction of FIG. 15) that is parallel to the main surface 430F of the first conductive type semiconductor layer 430.

The insulating reflective layer 674 may be disposed between the transparent electrode layer 160 covering the plurality of vertical type light-emitting structures 150 and the reflective electrode layer 480 and may reflect at least a portion of light radiated around the reflective electrode layer 480 from among light generated from an active layer 154 of each of the plurality of vertical type light-emitting structures 150. Before the light generated from the plurality of vertical type light-emitting structures 150 reaches the reflective electrode layer 480 in a path of light radiated toward the reflective electrode layer 480, the insulating reflective layer 674 may reflect the light in a direction that becomes more distant from the reflective electrode layer 480. Accordingly, light extraction efficiency may be improved by reducing or minimizing the number of reflections of light in the reflective electrode layer 480 to suppress optical loss.

The first and second electrodes 482 and 484 described with reference to FIGS. 9A and 9B or the first and second electrodes 482 and 484B described with reference to FIGS. 11A to 11C may be further formed in the semiconductor light-emitting device 600 illustrated in FIG. 15.

Figure 16:
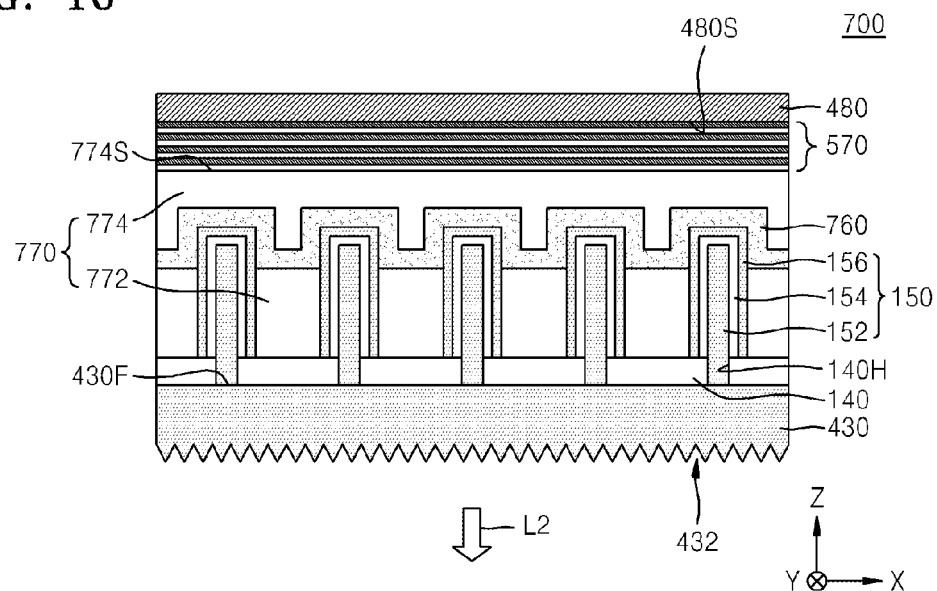

FIG. 16 is a cross-sectional view of a semiconductor light-emitting device 700 according to another example embodiment of the inventive concepts.

The semiconductor light-emitting device 700 has a structure that is substantially similar to that of the semiconductor light-emitting device 500 illustrated in FIG. 12. However, an insulation-filling layer 770 of the semiconductor light-emitting device 700 includes a first light-transmissive insulating layer 772 covering only a portion of each of a plurality of vertical type light-emitting structures 150 between the plurality of vertical type light-emitting structures 150, and a second light-transmissive insulating layer 774 that is separate from the first light-transmissive insulating layer 772 with a transparent electrode layer 760 interposed therebetween.

The transparent electrode layer 760 of the semiconductor light-emitting device 700 is formed to cover a portion of an upper side of each of the plurality of vertical type light-emitting structures 150 and the first light-transmissive insulating layer 772. The transparent electrode layer 760 is separate from an insulating pattern 140 with the first light-transmissive insulating layer 772 interposed therebetween, and is interposed between the first light-transmissive insulating layer 772 and the second light-transmissive insulating layer 774.

The first light-transmissive insulating layer 772 and the second light-transmissive insulating layer 774 may be formed of different materials selected from SOG, SiO$_2$, ZnO, SiN, Al$_2$O$_3$, and a combination thereof or the same material selected from them.

The second light-transmissive insulating layer 774 is disposed on the transparent electrode layer 760 and extends parallel to a main surface 430F of a first conductive type semiconductor layer 430. A surface 774S of the second light-transmissive insulating layer 774, which is relatively far from the plurality of vertical type light-emitting structures 150, is flat in a direction (X direction and/or Y direction of FIG. 16) that is parallel to the main surface 430F of the first conductive type semiconductor layer 430.

In the semiconductor light-emitting device 700 illustrated in FIG. 16, the transparent electrode layer 760 is formed to cover only a portion of each of the plurality of vertical type light-emitting structures 150. Accordingly, optical loss that may be caused since light generated from the plurality of vertical type light-emitting structures 150 penetrates the transparent electrode layer 760 may be reduced compared to the case in which the transparent electrode layer 160 extends over the entire length of a side wall of each of the plurality of vertical type light-emitting structures 150 as shown in FIG. 12. Accordingly, the light extraction efficiency of the semiconductor light-emitting device 700 may be improved.

The first and second electrodes 482 and 484 described with reference to FIGS. 9A and 9B or the first and second electrodes 482 and 484B described with reference to FIGS. 11A to 11C may be further formed in the semiconductor light-emitting device 700 illustrated in FIG. 16.

Figure 17:
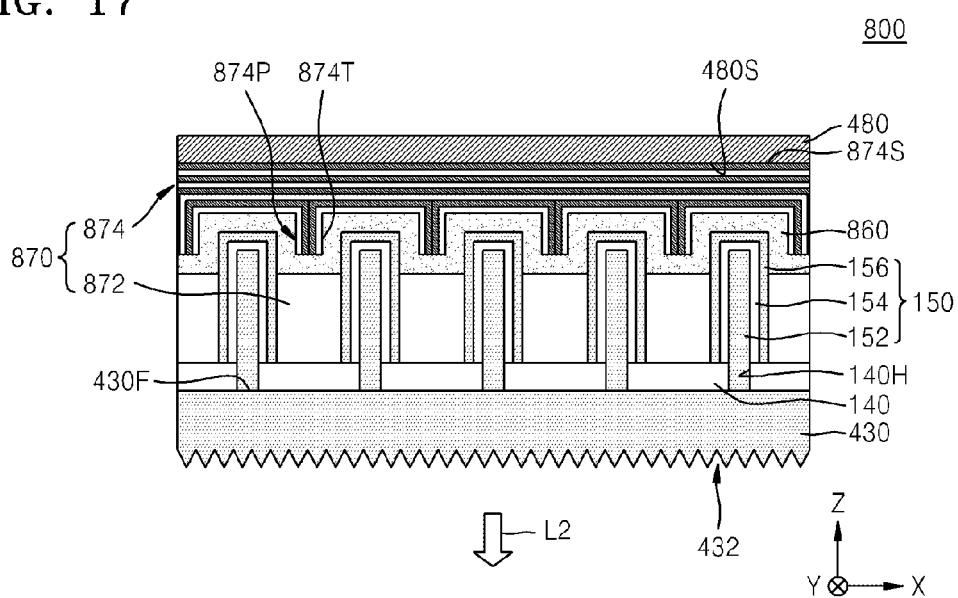

FIG. 17 is a cross-sectional view of a semiconductor light-emitting device 800 according to another example embodiment of the inventive concepts.

The semiconductor light-emitting device 800 has a structure that is substantially similar to that of the semiconductor light-emitting device 600 illustrated in FIG. 15. However, an insulation-filling layer 870 of the semiconductor light-emitting device 800 includes a light-transmissive insulating layer 872 covering only a portion of each of a plurality of vertical type light-emitting structures 150 between the plurality of vertical type light-emitting structures 150, and an insulating reflective layer 874 formed to cover a transparent electrode layer 860 at a location separate from the light-transmissive insulating layer 872. The insulating reflective layer 874 is interposed between the transparent electrode layer 860 and a reflective electrode layer 480.

The insulating reflective layer 874 is disposed on the transparent electrode layer 860 and extends parallel to a main surface 430F of a first conductive type semiconductor layer 430 so as to cover a top portion of each of the plurality of vertical type light-emitting structures 150.

The light-transmissive insulating layer 872 may be formed of SOG, SiO$_2$, ZnO, SiN, Al$_2$O$_3$, or a combination thereof.

The insulating reflective layer 874 may have a structure that is substantially the same as that of the insulating reflective layer 674 described with reference to FIG. 15. The insulating reflective layer 874 includes a plurality of step portions 874T corresponding to step portions formed in an upper surface of the transparent electrode layer 860 at a surface facing the transparent electrode layer 860. Due to the plurality of step portions 874T, the insulating reflective layer 874 includes a plurality of protruding portions 874P surrounded by the transparent electrode layer 860.

The insulating reflective layer 874 is disposed in the opposite side of a path for radiating light generated from the plurality of vertical type light-emitting structures 150 to the outside, and a surface 874S of the insulating reflective layer 874, which is relatively far from the plurality of vertical type light-emitting structures 150, is flat in a direction (X direction and/or Y direction of FIG. 17) that is parallel to the main surface 430F of the first conductive type semiconductor layer 430.

The insulating reflective layer 874 may be disposed between the transparent electrode layer 860 covering the plurality of vertical type light-emitting structures 150 and the reflective electrode layer 480 and may reflect at least a portion of light radiated around the reflective electrode layer 480 from among light generated from an active layer 154 of each of the plurality of vertical type light-emitting structures 150. Before the light generated from the plurality of vertical type light-emitting structures 150 reaches the reflective electrode layer 480 in a path of light radiated toward the reflective electrode layer 480, the insulating reflective layer 874 may reflect the light in a direction that becomes more distant from the reflective electrode layer 480. Accordingly, light extraction efficiency may be improved by reducing or minimizing the number of reflections of light in the reflective electrode layer 480 to suppress optical loss.

The transparent electrode layer 860 of the semiconductor light-emitting device 800 is formed to cover a portion of an upper side of each of the plurality of vertical type light-emitting structures 150 and the light-transmissive insulating layer 872. The transparent electrode layer 860 is separate from an insulating pattern 140 with the light-transmissive insulating layer 872 interposed therebetween and is interposed between the light-transmissive insulating layer 872 and the insulating reflective layer 874.

In the semiconductor light-emitting device 800 illustrated in FIG. 17, the transparent electrode layer 860 is formed to cover only a portion of each of the plurality of vertical type light-emitting structures 150. Accordingly, optical loss that may be caused since light generated from the plurality of vertical type light-emitting structures 150 penetrates the transparent electrode layer 860 may be reduced compared to the case in which the transparent electrode layer 160 extends over the entire length of a side wall of each of the plurality of vertical type light-emitting structures 150 as shown in FIG. 15. Accordingly, the light extraction efficiency of the semiconductor light-emitting device 800 may be improved.

The first and second electrodes 482 and 484 described with reference to FIGS. 9A and 9B or the first and second electrodes 482 and 484B described with reference to FIGS. 11A to 11C may be further formed in the semiconductor light-emitting device 800 illustrated in FIG. 17.

Figure 18:
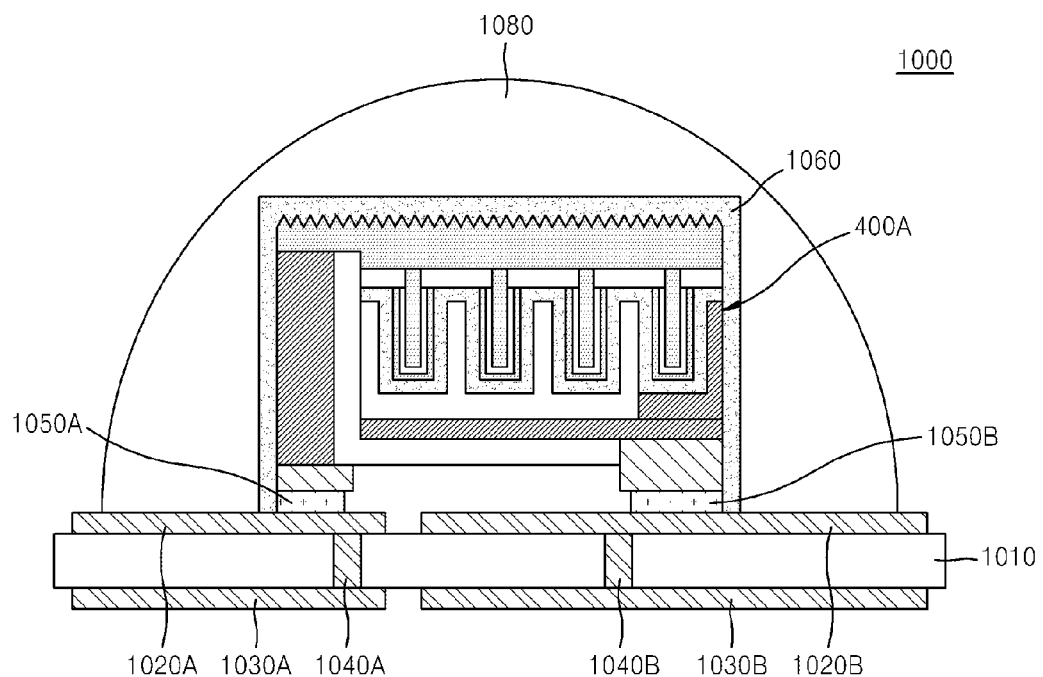
FIG. 18 is a cross-sectional view of a light-emitting device package including a semiconductor light-emitting device, according to some example embodiments of the inventive concepts.

FIG. 18 is a cross-sectional view of a light-emitting device package 1000 including a semiconductor light-emitting device, according to an example embodiment of the inventive concepts.

The light-emitting device package 1000 includes a package substrate 1010 and a semiconductor light-emitting device 400A mounted in a flip chip form on the package substrate 1010. A detailed structure of the semiconductor light-emitting device 400A is the same as described with reference to FIG. 9A.

A first upper electrode 1020A and a second upper electrode 1020B are formed on an upper surface of the package substrate 1010. A first lower electrode 1030A and a second lower electrode 1030B are formed on a lower surface of the package substrate 1010. The first upper electrode 1020A and the first lower electrode 1030A may be connected to each other via a first through electrode 1040A penetrating the package substrate 1010. The second upper electrode 1020B and the second lower electrode 1030B may be connected to each other via a second through electrode 1040B penetrating the package substrate 1010.

In some example embodiments, the first upper electrode 1020A, the second upper electrode 1020B, the first lower electrode 1030A, the second lower electrode 1030B, the first through electrode 1040A, and the second through electrode 1040B each may be formed of Cu, Au, Ag, Ni, W, Cr, or a combination thereof. However, the inventive concepts are not limited thereto.

The package substrate 1010 may be a circuit substrate such as a printed circuit board (PCB), a metal core PCB (MCPCB), a metal PCB (MPCB), or a flexible PCB (FPCB), or a ceramic substrate formed of AlN or $Al_2O_3$. In some example embodiments, a structure including a lead frame instead of the package substrate 1010 of FIG. 18 may be used.

A first electrode 482 and a second electrode 484 of the semiconductor light-emitting device 400A may be electrically connected to the first upper electrode 1020A and the second upper electrode 1020B via a bonding conductive layer 1050A and a bonding conductive layer 1050B, respectively.

The bonding conductive layer 1050A and the bonding conductive layer 1050B may be bonded to the first upper electrode 1020A and the second upper electrode 1020B, respectively, by using eutectic die bonding. To this end, the semiconductor light-emitting device 400A may be disposed on the package substrate 1010 such that the bonding conductive layer 1050A and the bonding conductive layer 1050B respectively face the first upper electrode 1020A and the second upper electrode 1020B, and then thermo-compression may be performed at a temperature of about 200 to 700° C. Since the bonding conductive layer 1050A and the bonding conductive layer 1050B are bonded to the first upper electrode 1020A and the second upper electrode 1020B, respectively, by using eutectic die bonding, an adhesive force having high reliability and high strength may be maintained.

The light-emitting device package 1000 may include a wavelength conversion unit 1060 covering a surface of the semiconductor light-emitting device 400A. The wavelength conversion unit 1060 may convert a wavelength of light emitted from the semiconductor light-emitting device 400A into another wavelength. In some example embodiments, the wavelength conversion unit 1060 may include a resin layer including phosphors or quantum dots.

The light-emitting device package 1000 may include a lens 1080 formed on the package substrate 1010. The lens 1080 may collect or disperse light generated from the semiconductor light-emitting device 400A. The lens 1080 may be formed of sapphire, silica, or calcium fluoride.

A surface of the lens 1080 which is exposed to the outside may have a dome shape as shown in FIG. 18. However, the inventive concepts are not limited thereto. For example, the lens 1080 may include a non-flat surface having various shapes such as an uneven shape and a concave shape.

FIG. 18 illustrates a case in which the light-emitting package 1000 includes the semiconductor light-emitting device 400A illustrated in FIG. 9A. However, the inventive concepts are not limited thereto. For example, the light-emitting device package 1000 may include at least one semiconductor light-emitting device selected from among the semiconductor light-emitting devices 100, 100A, 100B, 100C, 200, 300, 400, 400A, 400B, 400C, 500, 500A, 500B, 600, 700, and 800 illustrated in FIGS. 1 to 17, and semiconductor light-emitting devices modified or changed therefrom within a range of the inventive concepts.

Figure 19:
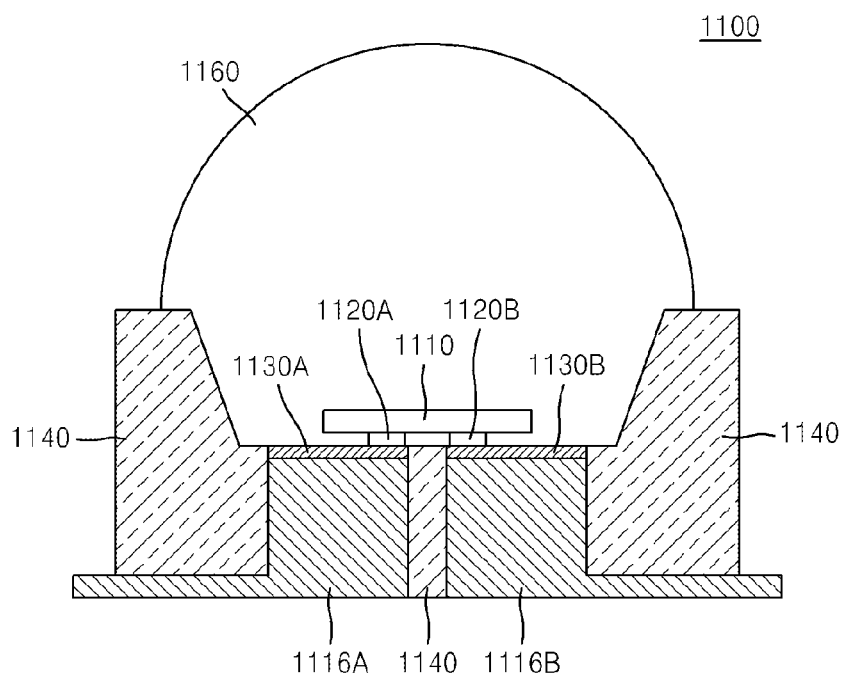
FIG. 19 is a cross-sectional view of a light-emitting device package including a semiconductor light-emitting device, according to some example embodiments of the inventive concepts.

FIG. 19 is a cross-sectional view of a light-emitting device package 1100 including a semiconductor light-emitting device, according to another example embodiment of the inventive concepts.

Referring to FIG. 19, the light-emitting device package 1100 includes a semiconductor light-emitting device 1100 and first and second electrodes 1116A and 1116B which are disposed under the semiconductor light-emitting device 1110 and to which the semiconductor light-emitting device 1110 is attached.

The semiconductor light-emitting device 1110 may include at least one semiconductor light-emitting device selected from among the semiconductor light-emitting devices 100, 100A, 100B, 100C, 200, 300, 400, 400A, 400B, 400C, 500, 500A, 500B, 600, 700, and 800 illustrated in FIGS. 1 to 17, and semiconductor light-emitting devices modified or changed therefrom within a range of the inventive concepts.

The semiconductor light-emitting device 1110 may be bonded in a flip chip form onto the first and second electrodes 1116A and 1116B. To this end, a P-electrode and an N-electrode of the semiconductor light-emitting device 1110 each may be connected to any one of the first and second electrodes 1116A and 1116B.

The first electrode 1116A and the second electrode 1116B are disposed separate from each other and may dissipate heat generated from the semiconductor light-emitting device 1110 at the same time as applying a voltage to the semiconductor light-emitting device 1110. A first bonding layer 1120A is interposed between the semiconductor light-emitting device 1110 and the first electrode 1116A, and a second bonding layer 1120B is interposed between the semiconductor light-emitting device 1110 and the second electrode 1116B. The first bonding layer 1120A and the second first bonding layer 1120B each may be formed of Au, In, Pb, Sn, Cu, Ag, a combination thereof, or an alloy thereof. In some example embodiments, a conductive adhesive may be used instead of the first bonding layer 1120A and the second first bonding layer 1120B.

A reflective layer 1130A and a reflective layer 1130B, which reflect light generated from the semiconductor light-emitting device 1110 towards the top of the semiconductor light-emitting device 1110, are coated on an upper surface of the first electrode 1116A and an upper surface of the second electrode 1116B, respectively. In some example embodiments, the first electrode 1116A and the second electrode 1116B may be formed of Ag or Al.

The first electrode 1116A and the second electrode 1116B are supported by a package housing 1140. The package housing 1140 may be formed of a material that is stable at a high temperature or a heat-resistant insulating material such as ceramic. A portion of the package housing 1140, which is interposed between the first electrode 1116A and the second electrode 1116B, electrically insulates the first electrode 1116A from the second electrode 1116B.

The semiconductor light-emitting device 1110 is encapsulated by the lens 1160. In some example embodiments, the lens 1160 condenses light from the semiconductor light-emitting device 1110 and may be formed of sapphire, silica, or calcium fluoride. In some example embodiments, a lens-shaped phosphor layer may be disposed instead of the lens 1160.

Figure 20:
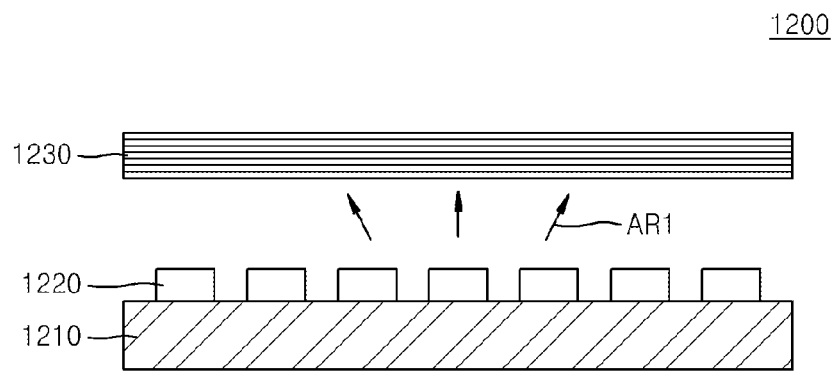
FIG. 20 is a diagram illustrating an example in which a semiconductor light-emitting device according to any one of the above example embodiments of the inventive concepts is applied to a back light unit.

FIG. 20 is a diagram illustrating an example in which a semiconductor light-emitting device according to any one of the above example embodiments of the inventive concepts are applied to a back light unit 1200.

Referring to FIG. 20, the back light unit 1200 includes a light source 1220 mounted on a substrate 1210, and at least one optical sheet 1230 disposed above the light source 1220. The light source 1220 may include at least one semiconductor light-emitting device selected from among the semiconductor light-emitting devices 100, 100A, 100B, 100C, 200, 300, 400, 400A, 400B, 400C, 500, 500A, 500B, 600, 700, and 800 illustrated in FIGS. 1 to 17, and semiconductor light-emitting devices modified or changed therefrom within a range of the inventive concepts.

In the back light unit 1200, the light source 1220 may emit light toward the optical sheet 1230 as indicated by an arrow ARI.

Figure 21:
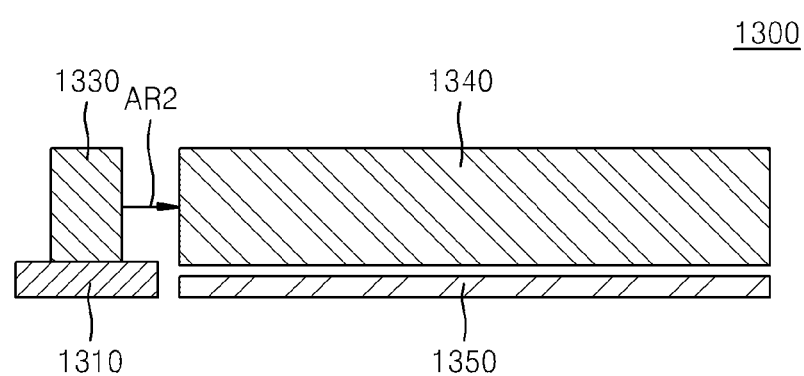
FIG. 21 is a diagram illustrating another example in which a semiconductor light-emitting device according to any one of the above example embodiments of the inventive concepts is applied to a back light unit.

FIG. 21 is a diagram illustrating another example in which a semiconductor light-emitting device according to any one of the above embodiments of the inventive concepts is applied to a back light unit 1300.

In the back light unit 1300 of FIG. 21, light from a light source 1330 mounted on a substrate 1310 is emitted toward a light guiding panel 1340 in a direction indicated by an arrow AR2. The light emitted in this manner may be incident on the light guiding panel 1340 and then be converted into a form of a surface light source. Light passing through the light guiding panel 1340 may be radiated upward. A reflective layer 1350 may be disposed under the light guiding panel 1340 to improve light extraction efficiency.

Figure 22:
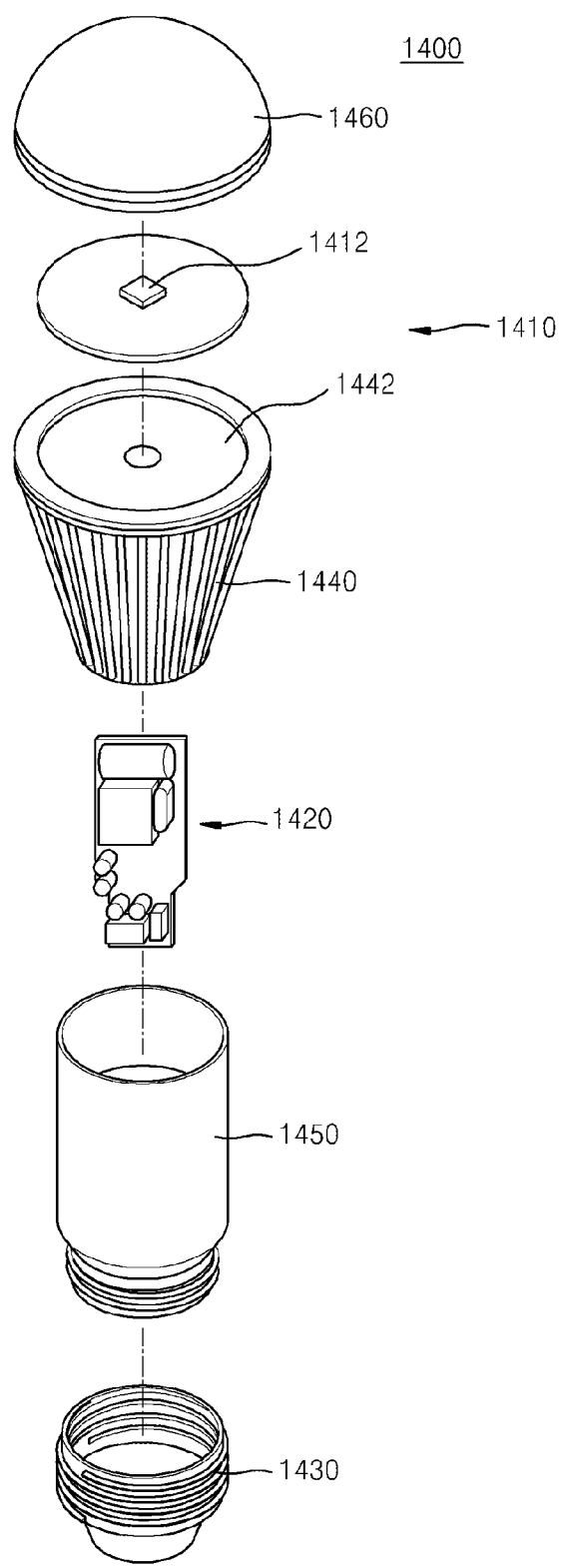
FIG. 22 is an exploded perspective view illustrating an example in which a semiconductor light-emitting device according to any one of the above example embodiments of the inventive concepts is applied to a lighting apparatus.

FIG. 22 is an exploded perspective view illustrating an example in which a semiconductor light-emitting device according to any one of the above example embodiments of the inventive concepts is applied to a lighting apparatus 1400.

The lighting apparatus 1400 including a bulb type lamp is illustrated in FIG. 22. The lighting apparatus 1400 includes a light-emitting module 1410, a driving unit 1420, and an external connection unit 1430. In addition, the lighting apparatus 1400 may further include an external housing 1440, an internal housing 1450, and a cover unit 1460.

The light-emitting module 1410 includes a semiconductor light-emitting device 1412. The semiconductor light-emitting device 1412 may include at least one semiconductor light-emitting device selected from among the semiconductor light-emitting devices 100, 100A, 100B, 100C, 200, 300, 400, 400A, 400B, 400C, 500, 500A, 500B, 600, 700, and 800 illustrated in FIGS. 1 to 17, and semiconductor light-emitting devices modified or changed therefrom within a range of the inventive concepts.

The external housing 1440 may function as a heat dissipation unit. The external housing 1440 may include a heat dissipation plate 1442 for improving a heat dissipation effect.

The cover unit 1460 may be mounted on the light-emitting module 1410 and have a convex lens shape.

The driving unit 1420 may be mounted in the internal housing 1450 and be connected to the external connection unit 1430 having a socket structure to receive a power supply voltage from an external power supply. In addition, the driving unit 1420 may be used for driving the semiconductor light-emitting device 1412 of the light-emitting module 1410. In some example embodiments, the driving unit 1420 may include an AC-DC converter or a rectification circuit component.

Figure 23:
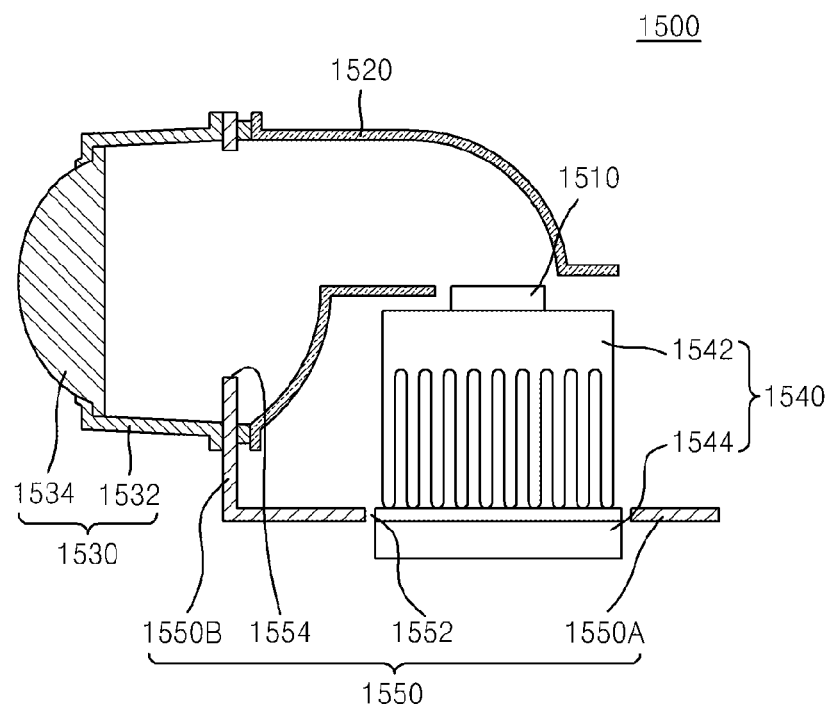
FIG. 23 is a diagram illustrating an example in which a semiconductor light-emitting device according to any one of the above example embodiments of the inventive concepts is applied to a head lamp.

FIG. 23 is a diagram illustrating an example in which a semiconductor light-emitting device according to any one of the above example embodiments of the inventive concepts is applied to a head lamp 1500.

Referring to FIG. 23, the head lamp 1500 includes a light source 1510, a reflective unit 1520, a lens cover unit 1530, a heat dissipation unit 1540, and a housing 1550. The lens cover unit 1530 may include a hollow guide 1532 and a lens 1534. The heat dissipation unit 1540 may dissipate heat generated from the light source 1510 to the outside. The heat dissipation unit 1540 may include a heat sink 1542 and a cooling fan 1544 so that effective heat dissipation is performed.

The housing 1550 may fix and support the reflective unit 1520 and the heat dissipation unit 1540. The housing 1550 includes a first surface 1550A and a second surface 1550B that is integrally connected to the first surface 1550A and is bent in a direction which is perpendicular to the first surface 1550A. A central hole 1552, through which the heat dissipation unit 1540 is combined so as to be mounted in the first surface 1550A, may be formed in the first surface 1550A of the housing 1550. In the housing 1550, a front hole 1554 for fixing the reflective unit 1520 so that the reflective unit 1520 is positioned above the light source 1510 may be formed in the second surface 1550B. Accordingly, a front side of the reflective unit 1520 may be opened, the reflective unit 1520 may be fixed to the housing 1550 so that the opened front side of the reflective unit 1520 corresponds to the front hole 1554, and light reflected from the reflective unit 1520 may pass through the front hole 1554 and be output to the outside.

The light source 1510 may include at least one semiconductor light-emitting device selected from among the semiconductor light-emitting devices 100, 100A, 100B, 100C, 200, 300, 400, 400A, 400B, 400C, 500, 500A, 500B, 600, 700, and 800 illustrated in FIGS. 1 to 17, and semiconductor light-emitting devices modified or changed therefrom within a range of the inventive concepts.

The head lamp 1500 may be used as a car light and the like.

Figure 24:
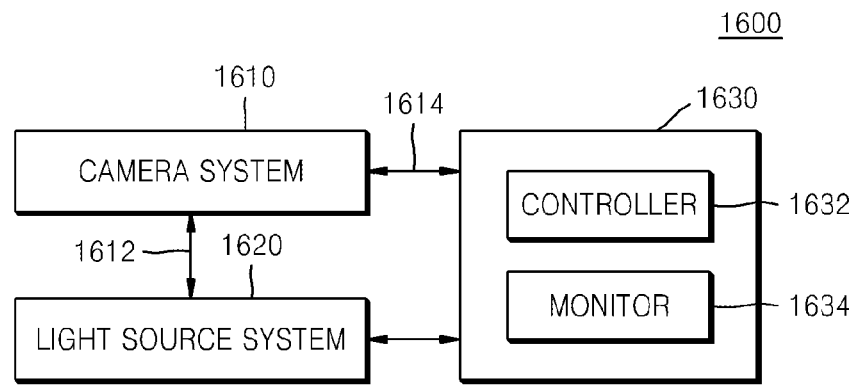
FIG. 24 is a block diagram of an optical processing system including a semiconductor light-emitting device according to any one of the above example embodiments of the inventive concepts.

FIG. 24 is a block diagram of an optical processing system 1600 including a semiconductor light-emitting device according to any one of the above example embodiments of the inventive concepts.

Referring to FIG. 24, the optical processing system 1600 includes a camera system 1610, a light source system 1620, and a data processing and analyzing system 1630.

The camera system 1610 may be disposed to face a target object for optical treatment by directly contacting the target object or being separate from the target object by a predetermined distance. In some example embodiments, the target object for optical treatment may be biological tissue, such as skin or a treatment area of a body. The camera system 1610 may be connected to the light source system 1620 via a light guide 1612. The light guide 1612 may include an optical fiber light guide through which light may be transmitted or a liquid light guide.

The light source system 1620 provides light to be irradiated to the target object for optical treatment through the light guide 1612. The light source system 1620 may include at least one semiconductor light-emitting device selected from among the semiconductor light-emitting devices 100, 100A, 100B, 100C, 200, 300, 400, 400A, 400B, 400C, 500, 500A, 500B, 600, 700, and 800 illustrated in FIGS. 1 to 17, and semiconductor light-emitting devices modified or changed therefrom within a range of the inventive concepts. Light that is emitted from the light source system 1620 may have a wavelength of about 200 nm to about 350 nm. In some example embodiments, the light source system 1620 may generate ultraviolet light and irradiate the generated ultraviolet light to biological tissue, such as skin or a disease area of a body.

The camera system 1610 may be connected to the data processing and analyzing system 1630 via a cable 1614. An image signal generated from the camera system 1610 may be transmitted to the data processing and analyzing system 1630 through the cable 1614. The data processing and analyzing system 1630 include a controller 1632 and a monitor 1634. The data processing and analyzing system 1630 may process, analyze, and store the image signal transmitted from the camera system 1610.

The optical processing system 1600 illustrated in FIG. 24 may be applied to various application areas, such as skin diagnosis, medical treatment equipment, disinfection devices, sterilization devices, washing devices, surgical supplies, beauty medical equipment, lighting devices, and information detection devices.

While the inventive concepts have been particularly shown and described with reference to example embodiments thereof, it will be understood that various changes in form and details may be made therein without departing from the spirit and scope of the following claims.

What is claimed is:

1. A semiconductor light-emitting device comprising:
    a first conductive type semiconductor layer having a main surface;
    a plurality of vertical type light-emitting structures protruding beyond the main surface of the first conductive type semiconductor layer;
    a transparent electrode layer covering at least a portion of each of the plurality of vertical type light-emitting structures; and
    an insulation-filling layer on the transparent electrode layer, the insulation-filling layer extending parallel to the main surface of the first conductive type semiconductor layer to cover an upper portion of each of the plurality of vertical type light-emitting structures, wherein
    a selected one of the first conductive type semiconductor layer and the insulation-filling layer has an uneven outer surface opposite to an inner surface of the selected one, the inner surface facing the plurality of vertical type light-emitting structures, and
    at least a portion of the insulation-filling layer directly contacts the transparent electrode layer.

2. The semiconductor light-emitting device of claim 1, wherein the selected one is on a light transmission path through which light generated from the plurality of vertical type light-emitting structures is radiated externally, and the other one of the first conductive type semiconductor layer and the insulation-filling layer, which is on the opposite side of the light transmission path, centered on the plurality of vertical type light-emitting structures, has a flat surface that is an opposite surface of a surface of the other one facing the plurality of vertical type light-emitting structures.

3. The semiconductor light-emitting device of claim 2, further comprising:
    a substrate covering a surface of the first conductive type semiconductor layer which is opposite to the main surface of the first conductive type semiconductor layer,
        wherein the substrate has a flat surface facing the first conductive type semiconductor layer.

4. The semiconductor light-emitting device of claim 1, further comprising:
    a substrate covering a surface of the first conductive type semiconductor layer which is opposite to the main surface of the first conductive type semiconductor layer,
        wherein the substrate has an uneven surface facing the first conductive type semiconductor layer.

5. The semiconductor light-emitting device of claim 1, wherein the insulation-filling layer comprises:
    a first portion filling spaces between the plurality of vertical type light-emitting structures; and
    a second portion integrally connected to the first portion, wherein the second portion is formed on the first portion and extends parallel to the main surface of the first conductive type semiconductor layer so as to cover an upper portion of each of the plurality of vertical type light-emitting structures.

6. The semiconductor light-emitting device of claim 1, wherein the insulation-filling layer comprises:
    a first insulating layer covering only a portion of each of the plurality of vertical type light-emitting structures between the plurality of vertical type light-emitting structures; and
    a second insulating layer on the first insulating layer, the second insulating layer extending parallel to the main surface of the first conductive type semiconductor layer so as to cover a top portion of each of the plurality of vertical type light-emitting structures.

7. The semiconductor light-emitting device of claim 6, wherein the first insulating layer and the second insulating layer each comprise:
a light-transmissive insulating layer, and the transparent electrode layer is between the first insulating layer and the second insulating layer.

8. The semiconductor light-emitting device of claim 6, further comprising:
a reflective electrode layer having a flat surface facing the plurality of vertical type light-emitting structures, wherein
the first insulating layer includes a light-transmissive insulating layer, and
the second insulating layer includes an insulating reflective layer that is between the light-transmissive insulating layer and the reflective electrode layer.

9. The semiconductor light-emitting device of claim 1, further comprising:
a reflective electrode layer having a flat surface facing the plurality of vertical type light-emitting structures, wherein
the insulation-filling layer includes,
a light-transmissive insulating layer covering only a portion of each of the plurality of vertical type light-emitting structures between the plurality of vertical type light-emitting structures; and
an insulating reflective layer extending parallel to the main surface of the first conductive type semiconductor layer so as to cover a top portion of each of the plurality of vertical type light-emitting structures between the light-transmissive insulating layer and the reflective electrode layer.

10. The semiconductor light-emitting device of claim 9, wherein the transparent electrode layer extends between the plurality of vertical type light-emitting structures and the light-transmissive insulating layer and between the plurality of vertical type light-emitting structures and the insulating reflective layer.

11. The semiconductor light-emitting device of claim 9, wherein the insulating reflective layer has a multi-layer structure in which at least two materials having different refractive indices are alternately stacked at least two times.

12. The semiconductor light-emitting device of claim 1, further comprising:
a light-transmissive insulating layer filling spaces between the plurality of vertical type light-emitting structures, wherein the transparent electrode layer is between the light-transmissive insulating layer and the insulation-filling layer.

13. The semiconductor light-emitting device of claim 1, further comprising:
a metal electrode layer on the insulation-filling layer and extending parallel to the main surface of the first conductive type semiconductor layer to cover the plurality of vertical type light-emitting structures, and has a flat surface facing the plurality of vertically type light-emitting structures.

14. The semiconductor light-emitting device of claim 13, further comprising:
an insulating reflective layer extending parallel to the main surface of the first conductive type semiconductor layer between the insulation-filling layer and the metal electrode layer, wherein the insulating reflective layer is configured to reflect light generated from the plurality of vertical type light-emitting structures in a direction that becomes more distant from the metal electrode layer before the light reaches the metal electrode layer in a path of light radiated toward the metal electrode layer.

15. A semiconductor light-emitting device comprising:
a first conductive type semiconductor layer having a main surface and a backside surface opposite to the main surface, the backside surface having an uneven portion;
a plurality of vertical type light-emitting structures protruding upward from the main surface of the first conductive type semiconductor layer;
a transparent electrode layer covering at least a portion of each of the plurality of vertical type light-emitting structures;
an insulation-filling layer on the first conductive type semiconductor layer, the insulation-filling layer covering at least a portion of each of the plurality of vertical type light-emitting structures;
a metal electrode layer on the insulation-filling layer, the metal electrode layer extending parallel to the main surface of the first conductive type semiconductor layer to cover the plurality of vertical type light-emitting structures and having a flat surface facing the plurality of vertical type light-emitting structures; and
an insulating reflective layer extending parallel to the main surface of the first conductive type semiconductor layer between the insulation-filling layer and the metal electrode layer.

16. The semiconductor light-emitting device of claim 15, wherein the insulation-filling layer comprises:
a first portion filling spaces between the plurality of vertical type light-emitting structures; and
a second portion integrally connected to the first portion, wherein the second portion is formed on the first portion and extends parallel to the main surface of the first conductive type semiconductor layer so as to cover an upper portion of each of the plurality of vertical type light-emitting structures.

17. The semiconductor light-emitting device of claim 15, wherein
the insulation-filling layer comprises a first light-transmissive insulating layer covering a portion of each of the plurality of vertical type light-emitting structures between the plurality of vertical type light-emitting structures, and
the first light-transmissive insulating layer is between the transparent electrode layer and the insulating reflective layer.

18. The semiconductor light-emitting device of claim 15, wherein
the insulation-filling layer comprises a first light-transmissive insulating layer covering a portion of each of the plurality of vertical type light-emitting structures between the plurality of vertical type light-emitting structures, and
the transparent electrode layer is between the first light-transmissive insulating layer and the insulating reflective layer.

19. The semiconductor light-emitting device of claim 18, further comprising a second light-transmissive insulating layer between the transparent electrode layer and the insulating reflective layer.

20. A semiconductor light-emitting device comprising:
a first conductive, type semiconductor layer;

a plurality of vertical type light-emitting structures protruding upward from the first conductive type semiconductor layer;

a transparent electrode layer covering at least a portion of each of the plurality of vertical type light-emitting structures;

an insulation-filling layer on the transparent electrode, the insulation-filling layer extending parallel to the first conductive type semiconductor layer so as to cover a top portion of each of the plurality of vertical type light-emitting structures;

a first electrode connected to the transparent electrode via the insulation-filling layer, the first electrode extending in a finger-type on the transparent electrode layer to cover a portion of each of the plurality of vertical type light-emitting structures; and a second electrode connected to the first conductive type semiconductor layer, wherein the first conductive type semiconductor layer has a first inner surface and a flat outer surface opposite to the first inner surface, the first inner surface facing the plurality of vertical type light-emitting structures, and wherein the insulation-filling layer has a second inner surface and an uneven outer surface opposite to the second inner surface, the second inner surface facing the plurality of vertical type light-emitting structures, has an uneven portion.

* * * * *